United States Patent
Nakayama et al.

(10) Patent No.: US 9,005,487 B2
(45) Date of Patent: Apr. 14, 2015

(54) TABLET FOR ION PLATING, PRODUCTION METHOD THEREFOR AND TRANSPARENT CONDUCTIVE FILM

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 519 days.

(21) Appl. No.: 13/388,798

(22) PCT Filed: Jul. 29, 2010

(86) PCT No.: PCT/JP2010/062816
§ 371 (c)(1),
(2), (4) Date: Mar. 21, 2012

(87) PCT Pub. No.: WO2011/016387
PCT Pub. Date: Feb. 10, 2011

(65) Prior Publication Data
US 2012/0175570 A1     Jul. 12, 2012

(30) Foreign Application Priority Data
Aug. 5, 2009 (JP) ................. 2009-182761

(51) Int. Cl.
*H01B 1/08* (2006.01)
*C23C 14/08* (2006.01)
(Continued)

(52) U.S. Cl.
CPC .............. *C04B 35/01* (2013.01); *C04B 35/645* (2013.01); *C23C 14/08* (2013.01);
(Continued)

(58) Field of Classification Search
CPC ............ H01B 1/08; H01B 5/14; C04B 35/01; C23C 14/086; C23C 14/32
USPC ........................ 252/518.1, 520.1; 204/192.15
See application file for complete search history.

(56) References Cited

U.S. PATENT DOCUMENTS

| 2004/0231981 A1 | 11/2004 | Takahashi et al. |
| 2007/0209928 A1 | 9/2007 | Inoue et al. |
| 2010/0129660 A1 | 5/2010 | Nakayama et al. |
| 2012/0175569 A1* | 7/2012 | Nakayama et al. ........ 252/520.2 |

FOREIGN PATENT DOCUMENTS

| JP | 8-260134 A | 10/1996 |
| JP | 9-176841 A | 7/1997 |

(Continued)

OTHER PUBLICATIONS

Extended European Search Report dated Jan. 2, 2013, issued in corresponding European Patent Application No. 10806386.8 (3 pages).

(Continued)

*Primary Examiner* — Mark Kopec
(74) *Attorney, Agent, or Firm* — Westerman, Hattori, Daniels & Adrian, LLP

(57) ABSTRACT

A tablet for ion plating enables to attain high rate film-formation of a transparent conductive film suitable for a blue LED or a solar cell, and a noduleless film-formation not generating splash, an oxide sintered body most suitable for obtaining the same, and a production method thereof. A tablet for ion plating obtained by processing an oxide sintered body includes indium and cerium as oxides, and having a cerium content of 0.3 to 9% by atom, as an atomicity ratio of Ce/(In+Ce). The oxide sintered body has an $In_2O_3$ phase of a bixbyite structure as a main crystal phase, has a $CeO_2$ phase of a fluorite-type structure finely dispersed as crystal grains having an average particle diameter of equal to or smaller than 3 μm, as a second phase. The oxide sintered body is produced by (a) mixing raw material powder consisting of indium oxide powder with an average particle diameter of equal to or smaller than 1.5 μm, then (b) molding the mixed powder, and sintering the molding by a normal pressure sintering method, or (b') molding and sintering the mixed powder by a hot press method.

11 Claims, 4 Drawing Sheets

(51) Int. Cl.
*C04B 35/01* (2006.01)
*C04B 35/645* (2006.01)
*C23C 14/34* (2006.01)

(52) U.S. Cl.
CPC .... *C23C 14/3414* (2013.01); *C04B 2235/3229* (2013.01); *C04B 2235/3232* (2013.01); *C04B 2235/3244* (2013.01); *C04B 2235/3256* (2013.01); *C04B 2235/3258* (2013.01); *C04B 2235/3284* (2013.01); *C04B 2235/3286* (2013.01); *C04B 2235/3293* (2013.01); *C04B 2235/5436* (2013.01); *C04B 2235/5445* (2013.01); *C04B 2235/5472* (2013.01); *C04B 2235/6562* (2013.01); *C04B 2235/6565* (2013.01); *C04B 2235/6567* (2013.01); *C04B 2235/6581* (2013.01); *C04B 2235/6585* (2013.01); *C04B 2235/6586* (2013.01); *C04B 2235/668* (2013.01); *C04B 2235/77* (2013.01); *C04B 2235/786* (2013.01); *C04B 2235/95* (2013.01); *C04B 2235/963* (2013.01)

(56) References Cited

FOREIGN PATENT DOCUMENTS

| | | |
|---|---|---|
| JP | 2004-149883 A | 5/2004 |
| JP | 2005-123124 A | 5/2005 |
| JP | 2005-242264 A | 9/2005 |
| JP | 2005-290458 A | 10/2005 |
| JP | 2005-320192 A | 11/2005 |
| JP | 2008-308385 A | 12/2008 |
| JP | 2009-62602 A | 3/2009 |
| WO | 2009/008297 A1 | 1/2009 |

OTHER PUBLICATIONS

"Technology of Transparent Conductive Oxide Thin-Films (the second Revised version)", Ohmsha, Ltd., Dec. 20, 2006, pp. 238-239, No English Abstract/translation.

Yasuhiro Seto, "Developments of Transparent Conductive Films", CMC, 1st Edition, Mar. 1, 1999, pp. 117-125, No English Abstract/translation.

International Search Report of PCT/JP2010/062816, mailing date of Nov. 2, 2010.

* cited by examiner

TABLET FOR ION PLATING, PRODUCTION METHOD THEREFOR AND TRANSPARENT CONDUCTIVE FILM

TECHNICAL FIELD

The present invention relates to a tablet for ion plating, a production method therefor and a transparent conductive film, and in more detail, the present invention relates to a tablet for ion plating which enables to attain a high rate film-formation of a transparent conductive film suitable for a blue LED or a solar cell, and a splash-less film-formation, an oxide sintered body most suitable for obtaining the same, and a production method thereof.

BACKGROUND ART

A transparent conductive film, because of having high conductivity and high transmittance in a visible light region, has been utilized in an electrode or the like, for a solar cell or a liquid crystal display element, and other various light receiving elements, as well as a heat ray reflection film for an automotive window or construction use, an antistatic film, and a transparent heat generator for various anti-fogging for a refrigerator showcase and the like.

As a well known practical transparent conductive film, there has been included a thin film of tin oxide ($SnO_2$)-type, zinc oxide (ZnO)-type, indium oxide ($In_2O_3$)-type. As the tin oxide-type, the one containing antimony as a dopant (ATO), or the one containing fluorine as a dopant (FTO) has been utilized, and as the zinc oxide-type, the one containing aluminum as a dopant (AZO), or the one containing gallium as a dopant (GZO) has been utilized. However, the transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

The transparent conductive film with low resistance is suitably used widely in a surface element or a touch panel or the like, of such as for a solar cell, a liquid crystal, an organic electroluminescence and an inorganic electroluminescence. As a production method for these transparent conductive films, a sputtering method or an ion plating method has been used often. This sputtering method is an effective method in film-formation of a material with low vapor pressure, or when control of precise film thickness is required, and because of very simple and easy operation thereof, it has been widely used industrially.

In a sputtering method, a target for sputtering is used as a raw material of a thin film. The target is a solid containing a metal element constituting the thin film to be formed, and a sintered body such as a metal, a metal oxide, a metal nitride, a metal carbide, or, in certain cases, a single crystal is used. In this method, in general, after making high vacuum once with a vacuuming apparatus, rare gas (argon or the like) is introduced, and under a gas pressure of equal to or lower than about 10 Pa, a substrate is set as an anode and a target is set as a cathode to generate glow discharge between them and generate argon plasma, and argon cations in the plasma are collided with the target of the cathode, and particles of the target component flicked thereby are deposited on the substrate to form a film.

A sputtering method is classified by a generation method of argon plasma, and a method using high frequency plasma is called a high frequency sputtering method, and a method using direct-current plasma is called a direct-current sputtering method.

In general, a direct-current sputtering method has been utilized industrially in a wide range, because it provides higher film-formation rate and lower cost of power source facility and simpler film-formation operation, as compared with the high frequency sputtering method. However, the direct-current sputtering method has a disadvantage of requiring use of a conductive target, as compared with the high frequency sputtering method, which can provide film-formation even by using an insulating target.

Film-formation rate of a sputtering has close relation to chemical bond of a target substance. Because a sputtering is a phenomenon that argon cations having a kinetic energy are collided to the target surface, and a substance of a target surface is flicked by receiving energy, the weaker inter-ionic bond or inter-atomic bond of the target substance increases the more probability of jumping out by sputtering.

In film-formation of a transparent conductive film of an oxide such as ITO by using a sputtering method, there are a method for film-formation of an oxide film by a reactive sputtering method in mixed gas of argon and oxygen, by using an alloy target (an In—Sn alloy in the case of the ITO film) of metals constituting the film, and a method for film-formation of an oxide film by a reactive sputtering method for performing a sputtering in mixed gas of argon and oxygen, by using an oxide sintered body target (an In—Sn—O sintered body in the case of the ITO film) composed of an oxide of metal constituting the film.

Among these, in a method for using the alloy target, relatively high amount of oxygen gas is supplied during sputtering, however, because dependence of film-formation rate or film characteristics (specific resistance, transmittance) on amount of oxygen gas to be introduced during film-formation is extremely high, it is difficult to produce stably a transparent conductive film having a constant film thickness or characteristics.

On the other hand, a method for using the metal oxide target supplies a part of oxygen supplied to the film from the target by sputtering, and thus residual deficient oxygen amount is supplied as oxygen gas, and dependence of characteristics (specific resistance, transmittance or the like) of the film on film-formation rate or oxygen gas amount to be introduced during film-formation is smaller than the case of using the alloy target, and because the transparent conductive film having constant film thickness and characteristics can be produced stably, a method for using the oxide target has been adopted industrially.

From such a background, in the case of mass production of the transparent conductive film by film-formation using the sputtering method, the direct-current sputtering method using the metal oxide target has been mainly adopted. Here, in consideration of productivity or production cost, characteristics of the oxide target during direct-current sputtering become important. That is, such an oxide target is useful that provides higher film-formation rate in the case of charging the same power. Still more, because film-formation rate becomes the higher, when the higher direct-current sputtering is charged, such an oxide target becomes useful industrially that is capable of film-forming stably without generation of target cracking or abnormal discharge caused by arcing due to nodule generation, even when high direct-current power is charged.

Here, the nodule means a black precipitate (protruded substance) generating at an erosion part of the target surface (meaning a site of the target being sputtered), excluding a very small part at the deepest part of erosion, when sputtering of the target proceeds. In general, the nodule is said not to be a deposition of an foreign flying substance or a reaction product at the surface, but a digging residue by sputtering. The nodule causes abnormal discharge such as arcing, and it has been known that arcing is suppressed by reducing the nodule (refer to NON-PATENT LITERATURE 1). Therefore, for performing stable film-formation, use of such an oxide target is necessary that does not generate the nodule, that is, a digging residue by sputtering.

On the other hand, the ion plating method is a method for evaporating a metal or a metal oxide by resistance heating or electron-beam heating, under a pressure of about $10^{-3}$ to $10^{-2}$ Pa, and still more activating the evaporated substance using plasma and reaction gas (oxygen) to deposit it on a substrate. Also as for the tablet for ion plating (it may also be called a tablet of pellet) to be used in forming the transparent conductive film, similarly as in the target for sputtering, use of an oxide tablet enables to more stably produce a transparent conductive film having constant film thickness and constant characteristics. The oxide tablet is required to evaporate uniformly, and it is preferable that a substance having stable chemical bond and difficult to be evaporated is not present together with a substance which is present as a main phase and easily evaporated.

In addition, a method for forming a thin film by evaporation and ionization of the oxide sintered body of an evaporation substance (tablet) by an ion plating method has a problem that splash of the evaporation substance is generated in heating, thus causing a pinhole defect in a deposited film by scattering particles. Splash means the following phenomenon. That is, when the evaporation substance (tablet) is heated in vacuum, by irradiation of plasma beams or electron beams, the evaporation substance vaporizes when temperature reached a certain level, and uniform evaporation starts in an atomic state. Splash means a phenomenon where spray substances with a visible size of about several μm to 1000 μm fly out from the evaporation substance with being mixed in uniform evaporation gas, in this case, and collides onto the vapor deposition film. Once this phenomenon occurs, it causes pinhole defect or the like at the vapor deposition film, by collision of the spray substances, which not only impairs uniformity of the vapor deposition film but also deteriorates performance as a conductive film.

As described above, it can be said that in order to form the transparent conductive film of an oxide such as ITO by the direct-current sputtering method, use of such an oxide target is important that is capable of stable film-formation without generation of abnormal discharge caused by arcing due to nodule generation, and in forming by the ion plating method, and it can be said important to use such an oxide target that little generate splash of the evaporation substance in heating, thus little generating a pinhole defect in a vacuum deposited film by scattering particles.

By the way, many of the transparent conductive films such as ITO film, formed by the above process, are n-type degenerated semiconductors, and largely contribute to enhance conductivity of electrons of carriers. Therefore, conventionally, in order to make low resistance of the ITO film, carrier electron concentration has been made to increase as high as possible.

The ITO film has been known to have a crystallization temperature of generally about 190 to 200° C., and bordering on this temperature, an amorphous film or a crystalline film is formed. For example, in the case of film-formation by a sputtering method while maintaining the substrate at room temperature, the amorphous film is obtained, because thermal energy required in crystallization cannot be given. On the other hand, in the case where a substrate temperature is equal to or higher than the crystallization temperature, for example, about 300° C., the crystalline film is formed.

In the amorphous film and the crystalline film of ITO, generation mechanism of carrier electrons is different. In general, in the case of the amorphous film, nearly all of the carrier electrons is generated by oxygen deficiency. On the other hand, in the case of the crystalline film, generation of the carrier electrons is expected by not only oxygen deficiency but also tin doping effect.

Indium oxide takes a crystal structure called bixbyite of a stable cubic system crystal phase, under normal pressure or pressure lower than that. By substitution of a lattice point of tri-valent indium in the bixbyite structure with tetra-valent tin, the carrier electrons are generated. Tin is an element which is capable of increasing carrier electron concentration most, as a dopant, and it has been known that the addition of 10% by weight as converted to tin oxide is capable of making low resistance most. That is, by converting the ITO film to a crystalline film, carrier electrons are generated in a large quantity by both of oxygen deficiency and the tin dopant, and therefore it is possible to form a film showing lower electric resistance as compared with an amorphous film having only oxygen deficiency.

However, in an LED (light Emitting Diode) or a solar cell whose progress has been significant in recent years, there has emerged a case requiring characteristics which is difficult to attain by ITO. As one example thereof, in a blue LED, to enhance light extraction efficiency, high refractive index of the transparent conductive film has been necessary for blue light at the vicinity of a wavelength of 460 nm. As a light emitting layer of the blue LED, a gallium nitride layer is used. As an optical characteristics of the gallium nitride layer, refractive index as high as about 2.4 is included. In order to enhance efficiency of light extraction from the light emitting layer, it is necessary to enhance consistency of refractive indexes of the transparent conductive film and the gallium nitride layer, and the transparent conductive film is required to have a refractive index of as near as 2.4. Refractive index is a value specific to a substance, and generally known refractive index of indium oxide is as low as 1.9 to 2.0. In addition, the transparent conductive film is required to have low surface resistance. It is because current diffusion is not sufficient in a film surface direction, as electrical characteristics of the gallium nitride layer. However, when it is tried to decrease electric resistance by increasing carrier electron concentration, refractive index of the indium oxide-type transparent conductive film becomes lowered further than 1.9 to 2.0 to 1.8 to 1.9. As described above, because the ITO film is a material having significantly increased carrier electron concentration owing to tin as a dopant, trying to obtain a crystalline film with such a low resistance results in decreasing refractive index, and this has been a problem to be solved.

In addition, other than refractive index or specific resistance, characteristics such as patterning property by wet etching or the like, superior than that of the ITO film, is required. Also in the above blue LED, such a process is preferable that makes low resistance by performing patterning by wet etching using a weak acid on the amorphous transparent conductive film formed at low temperature, and then by heat treatment under non-oxidative atmosphere to crystallize the amorphous transparent conductive film. By using this process, it is possible to form a transparent electrode having highly fine patterning.

As other application examples of the transparent conductive film, there is a solar cell. In the case of using it as a surface electrode of a solar cell, when the transparent conductive film has high transmittance of not only visible light but also infrared light, solar light can be taken in efficiently. The ITO film is capable of decreasing specific resistance, however, because of high carrier electron concentration, there was a problem of high reflectance or absorption of infrared light, and thus decreasing transmittance.

In addition, in the case of using it as a part of a rear surface electrode, there may be the case of using a transparent conductive film having enhanced refractive index, for performing adjustment of refractive index of the whole module, aiming at enhancing incorporation efficiency of solar light, however, also in this case, the ITO film was insufficient because of the same reason as in a blue LED application. However, in a solar cell application, it is not required such high-definition patterning by wet etching using a weak acid, that is required in the blue LED.

As one method for enhancing refractive index of the indium oxide-type transparent conductive film, there is a method for adding an oxide having high refractive index.

In PATENT LITERATURE 1, there has been described a sputtering target, which is capable of efficiently forming a transparent thin film with superior moisture-proof property, on a silver-type thin film by a sputtering method, and gives little damage to the above silver-type thin film, and there has been proposed a sputtering target composed of a conductive transparent metal oxide containing an oxide of a metal element substantially not having a solid solution region with silver, wherein content ratio of the above metal substantially not having a solid solution region with silver, is 5 to 40% by atom relative to the metal element of the conductive transparent metal oxide. Specifically, it has been described that containing of at least a titanium element or a cerium element is preferable, as the metal element substantially not having a solid solution region with silver, and as a metal element similarly applicable, there has been included a zirconium element, a hafnium element, a tantalum element. In addition, there has been described that indium oxide is preferable as the conductive transparent metal oxide.

In addition, in PATENT LITERATURE 1, there has been described that because the metal oxide of the titanium element or the cerium element, which is the metal element substantially not having a solid solution region with silver, has a high refractive index of equal to or higher than 2.3, and as said high refractive index material, total content rate of the titanium element and the cerium element is 5 to 40% by atom relative to the metal element of the conductive transparent metal oxide, it is possible to increase refractive index of the transparent conductive film, formed by using this sputtering target, up to about 2.1 to 2.3.

In addition, in PATENT LITERATURE 2, there has been proposed a sputtering target of a sintered body of a mixed oxide applicable in film-forming a transparent thin film of a conductive film with a composition sandwiching the silver-type thin film. In film-formation of the transparent thin film of the conductive film with a configuration sandwiching the silver-type thin film, in order to be able to effectively perform film-formation of the transparent thin film with superior moisture-proof property, and also to obtain a sputtering target where the above silver-type thin film little receives damage in this film-formation, specifically, a sintered body of the mixed oxide having contained tin oxide and/or titanium oxide in an amount lower than mixing ratio of each substrate, to a mixed oxide having indium oxide and cerium oxide as the substrate, is used. That is, similarly as in PATENT LITERATURE 1, because cerium oxide has high refractive index, also refractive index of the mixed oxide of indium oxide and cerium oxide becomes high, accompanying with addition ratio of cerium oxide.

Still more, because in the mixed oxide of indium oxide and cerium oxide, cerium oxide does not have sufficient conductivity, conductivity of a target using a sintered body of the mixed oxide abruptly decreases accompanying with increase in mixing ratio of cerium oxide, and thus providing a target with low conductivity, which makes difficult film-formation by a direct-current sputtering method.

As described above, according to PATENT LITERATUREs 1 and 2, it is expected to increase refractive index of the transparent thin film, formed by using this sputtering target, up to about 2.1 to 2.3, because efficient formation of the transparent thin film with superior moisture-proof property is possible by a sputtering method on the silver-type thin film, or because a metal oxide of a titanium element or a cerium element has a high refractive index of equal to or higher than 2.3. However, as described above, in the case of mass production of the transparent conductive film by film-formation using a direct-current sputtering method, in view of industrial usefulness of such an oxide target that is capable of stable film-formation without generation of target cracking or abnormal discharge caused by arcing due to nodule generation, even when high direct-current power is charged, it is necessary that nodule generation causing the above arcing is suppressed, or splash in an ion plating method is suppressed, when condition to increase film-formation rate, by increasing sputtering voltage or the like, is selected, but investigation on a texture or the like of the oxide sintered body enabling it has not been performed at all.

That is, there has not been considered to the point of industrially required characteristics, relating to the oxide sintered body to obtain a target or a tablet applicable to stable film-formation of the above transparent conductive film.

Still more, in PATENT LITERATUREs 1 and 2, although there has been investigated a method for production a sintered body to obtain a target, or a method for enhancing conductivity, by the simple addition of tin oxide or titanium oxide, there has not been investigated at all a method for enhancing density of a sintered body by detailed analysis and control of a texture of the oxide sintered body containing indium and cerium as oxides; or a method for avoiding arcing in film-formation using the above sputtering method, or splash in film-formation using the ion plating method. In addition, as for the case where a crystalline transparent conductive film was formed, there has not been investigated at all influence of tin oxide or titanium oxide, which is the addition element, on refractive index of the transparent conductive film.

On the other hand, in PATENT LITERATURE 3, there has been proposed an amorphous transparent conductive thin film which is extremely smooth and has a high work function, an oxide sintered body which is capable of forming stably said transparent conductive thin film, and a sputtering target using the same, and there has been described that it is desirable that said oxide sintered body contains 3% by mass to 20% by mass of cerium, 0.1% by mass to 4% by mass of tin, and 0.1% by mass to 0.6% by mass of titanium, and the remaining is substantially composed of indium and oxygen, and still more cerium, tin and titanium make a solid solution in an indium site, sintering density is equal to or higher than $7.0 \text{ g/cm}^3$, and average crystal grain diameter is equal to or smaller than 3 µm.

Also in this PATENT LITERATURE 3, there has not been investigated at all enhancement of refractive index of the crystalline transparent conductive film formed by using said sputtering target or tablet. In particular, there has not been referred at all to influence of tin on decrease in refractive index.

Still more, as for said oxide sintered body, average particle diameter of a crystal grain of indium oxide, where cerium, tin and titanium make a solid solution in an indium site, is controlled at equal to or smaller than 3 μm, aiming at suppressing sintering crack during sputtering and nodule generation at that part, however, there has not been investigated at all a problem that cerium does not make a solid solution in indium oxide, and is present as crystal grains of cerium oxide, which becomes a starting point of a nodule.

In addition, in PATENT LITERATURE 4, there has been described a sputtering target characterized in that, in a sputtering target composed of indium oxide and cerium oxide, in the case of observing crystal peaks using X-ray diffraction, presence of peaks derived from indium oxide and cerium oxide are observed, and in performing EPMA measurement, diameter of a cerium oxide particle dispersed in indium oxide is found to be equal to or smaller than 5 μm.

This PATENT LITERATURE 4 has not investigated at all enhancement of refractive index and decrease in resistance of a crystalline transparent conductive film, formed by using a sputtering target or tablet composed of indium oxide and cerium oxide. In particular, there has not been referred at all to influence of tin on decreasing refractive index.

As described above, in conventional technology relating to an oxide sintered body containing indium and cerium having low specific resistance and high refractive index, sufficient investigation has not been performed on splash prevention or the like in ion plating film-formation, which becomes important in view of mass production of a crystalline transparent conductive film, and it has been desired emergence of an oxide sintered body containing indium and cerium, which has solved these problems.

CITATION LIST

Patent Literature

PATENT LITERATURE 1: JP-A-8-260134
PATENT LITERATURE 2: JP-A-9-176841
PATENT LITERATURE 3: JP-A-2005-320192
PATENT LITERATURE 4: JP-A-2005-290458

Non-Patent Literature

NON-PATENT LITERATURE 1: "Technology of a transparent conductive film (the second Revised version)", Ohmsha, Ltd., published on Dec. 20, 2006, pages 238 to 239
NON-PATENT LITERATURE 2: "New development of a transparent conductive film", CMC, published on Mar. 1, 1999, pages 117 to 125

SUMMARY OF THE INVENTION

Technical Problem

It is an object of the present invention to provide the tablet for ion plating which is capable of attaining high film-formation rate of the crystalline transparent conductive film having low specific resistance and high refractive index, and splash prevention, the oxide sintered body most suitable for obtaining such a tablet, and the production method therefor.

Solution to Problem

The present inventors have studied in detail on influence of a compositional phase and a texture of the oxide sintered body on production conditions such as film-formation rate and the like, or splash generation in ion plating, by preparing many oxide sintered body samples by changing the compositional phase and the texture of the oxide sintered body composed of oxides containing indium and tin, and forming the transparent conductive film by an ion plating method, using the oxide tablet prepared these as raw materials.

As a result, we have found that splash generation in ion plating can be suppressed more, as compared with conventional cases, even in the case of enhancing film-formation rate by increasing charged power in forming the above transparent conductive film on a substrate, by (1) setting cerium content in the oxide sintered body containing indium and cerium as oxides, at 0.3 to 9% by atom as an atomicity ratio of Ce/(In+Ce), or containing at least one or more kinds of an metal element (M element) selected from the metal element group consisting of titanium, zirconium, hafnium, molybdenum and tungsten, as an oxide, and setting the content thereof at equal to or lower than 1% by atom, as an atomicity ratio of M/(In+Ce+M), as well as (2) by composing the above oxide sintered body with substantially an $In_2O_3$ phase of a bixbyite structure and a $CeO_2$ phase of a fluorite-type structure, and controlling the average particle diameter of crystal grains composed of a $CeO_2$ phase, dispersing in the $In_2O_3$ phase, at equal to or smaller than 3 μm, and setting the density at 3.4 to 5.5 g/cm³, and as a result, the crystalline transparent conductive film having low specific resistance and high refractive index can be obtained efficiently and stably, and have thus completed the present invention.

That is, according to a first aspect of the present invention, there is provided a tablet for ion plating obtained by processing an oxide sintered body comprising indium and cerium as oxides, and having a cerium content of 0.3 to 9% by atom, as an atomicity ratio of Ce/(In+Ce), characterized in that: said oxide sintered body has an $In_2O_3$ phase of a bixbyite structure as a main crystal phase, has a $CeO_2$ phase of a fluorite-type structure finely dispersed as crystal grains having an average particle diameter of equal to or smaller than 3 μm, as a second phase, and has a density of 3.4 to 5.5 g/cm³.

In addition, according to a second aspect of the present invention, there is provided, the tablet for ion plating, characterized in that, in the first aspect, the $In_2O_3$ phase of a bixbyite structure is composed of crystal grains with two kinds of average particle diameters, having a crystal grain with an average particle diameter of equal to or smaller than 2 μm and a crystal grain with an average particle diameter of equal to or larger than 2.5 μm.

In addition, according to a third aspect of the present invention, there is provided the tablet for ion plating, characterized in that, in the first aspect, the cerium content is 0.3 to 5% by atom, as an atomicity ratio of Ce/(In+Ce).

In addition, according to a fourth aspect of the present invention, there is provided the tablet for ion plating, characterized in that, in the first aspect, X-ray diffraction peak intensity ratio (I), defined by the following formula, is equal to or lower than 25%:

$$I=[CeO_2 phase(111)/In_2O_3 phase(222)] \times 100 [\%]$$

In addition, according to a fifth aspect of the present invention, there is provided the tablet for ion plating, characterized by, in the first aspect, further comprising, as an oxide, at least one or more kinds of an metal element (M element) selected from the metal element group consisting of titanium, zirconium, hafnium, molybdenum and tungsten, wherein the cerium content of 0.3 to 9% by atom, as an atomicity ratio of Ce/(In+Ce+M), an M element content of equal to or lower than 1% by atom, as an atomicity ratio of M/(In+Ce+M), and a total content of cerium and M element of equal to or lower than 9% by atom, as an atomicity ratio of (Ce+M)/(In+Ce+M).

In addition, according to a sixth aspect of the present invention, there is provided the tablet for ion plating, characterized in that, in the fifth aspect, the M element is titanium.

In addition, according to a seventh aspect of the present invention, there is provided the tablet for ion plating, by, in the first aspect, not comprising tin.

In addition, according to an eighth aspect of the present invention, there is provided a production method for a tablet for ion plating comprising a step to obtain a oxide sintered body by mixing raw material powder consisting of indium oxide powder with an average particle diameter of equal to or smaller than 1.5 µm, indium oxide powder with an average particle diameter of equal to or larger than 2 µm and cerium oxide powder with an average particle diameter of equal to or smaller than 1.5 µm, then molding the mixed powder, and after sintering the molding by a normal pressure sintering method, or after molding and sintering the mixed powder by a hot press method, and a step to process the oxide sintered body, wherein that the oxide sintered body after sintering has an $In_2O_3$ phase of a bixbyite structure, as a main crystal phase, finely dispersed with a $CeO_2$ phase of a fluorite-type structure, as a second phase, as crystal grains having an average particle diameter of equal to or smaller than 3 µm, and has a density of 3.4 to 5.5 g/cm$^3$.

In addition, according to a ninth aspect of the present invention, there is provided a production method for a tablet for ion plating comprising a step to obtain a oxide sintered body by adding and mixing oxide powder of at least one or more kinds of an M element selected from the M metal element group consisting of titanium, zirconium, hafnium, molybdenum and tungsten, having an average particle diameter of equal to or smaller than 1.5 µm, to raw material powder consisting of indium oxide powder with an average particle diameter of equal to or smaller than 1.5 µm, indium oxide powder with an average particle diameter of equal to or larger than 2 µm, and cerium oxide powder with an average particle diameter of equal to or smaller than 1.5 µm, and then molding the mixed powder, and after sintering the molding by a normal pressure sintering method, or after molding and sintering the mixed powder by a hot press method, and a step to process the oxide sintered body, wherein that the oxide sintered body after sintering has an $In_2O_3$ phase of a bixbyite structure as a main crystal phase, has a $CeO_2$ phase of a fluorite-type structure finely dispersed as crystal grains having an average particle diameter of equal to or smaller than 3 µm, as a second phase, and has a density of 3.4 to 5.5 g/cm$^3$.

In addition, according to a tenth aspect of the present invention, there is provided the production method for the tablet for ion plating, characterized in that, in the eighth or the ninth aspect, the raw material powder is sintered at a sintering temperature of 1000 to 1200° C. for 10 to 30 hours, under oxygen-containing atmosphere.

In addition, according to an eleventh aspect of the present invention, there is provided the production method for the tablet for ion plating, characterized in that, in the eighth or the ninth aspect, the raw material powder is sintered at a sintering temperature of 700 to 800° C. for 1 to 3 hours, under a pressure of 2.45 to 9.80 MPa, under inert gas atmosphere or in vacuum, by a hot press method.

Still more, according to a twelfth aspect of the present invention, there is provided, a transparent conductive film, characterized by being formed on a substrate by an ion plating method, using the tablet for ion plating of the first to the seventh aspects.

Advantageous Effects of Invention

Because the oxide sintered body containing indium and cerium relevant to the present invention has a cerium content of 0.3 to 9% by atom, as an atomicity ratio of Ce/(In+Ce), and contains the $In_2O_3$ phase of a bixbyite structure, as a main crystal phase, has a $CeO_2$ phase of a fluorite-type structure finely dispersed as crystal grains having an average particle diameter of equal to or smaller than 3 µm, as a second phase, splash generation in ion plating can be suppressed, even in increased film-formation rate, in obtaining an oxide transparent conductive film using said oxide sintered body by an ion plating method. In this way, it is possible to shift to film-formation condition with increased film-formation rate, and mass production of the transparent conductive film is possible. As a result, the crystalline transparent conductive film having low specific resistance and high refractive index, containing indium and cerium, can be obtained efficiently, which is extremely useful industrially.

DESCRIPTION OF EMBODIMENTS

Figure 1:
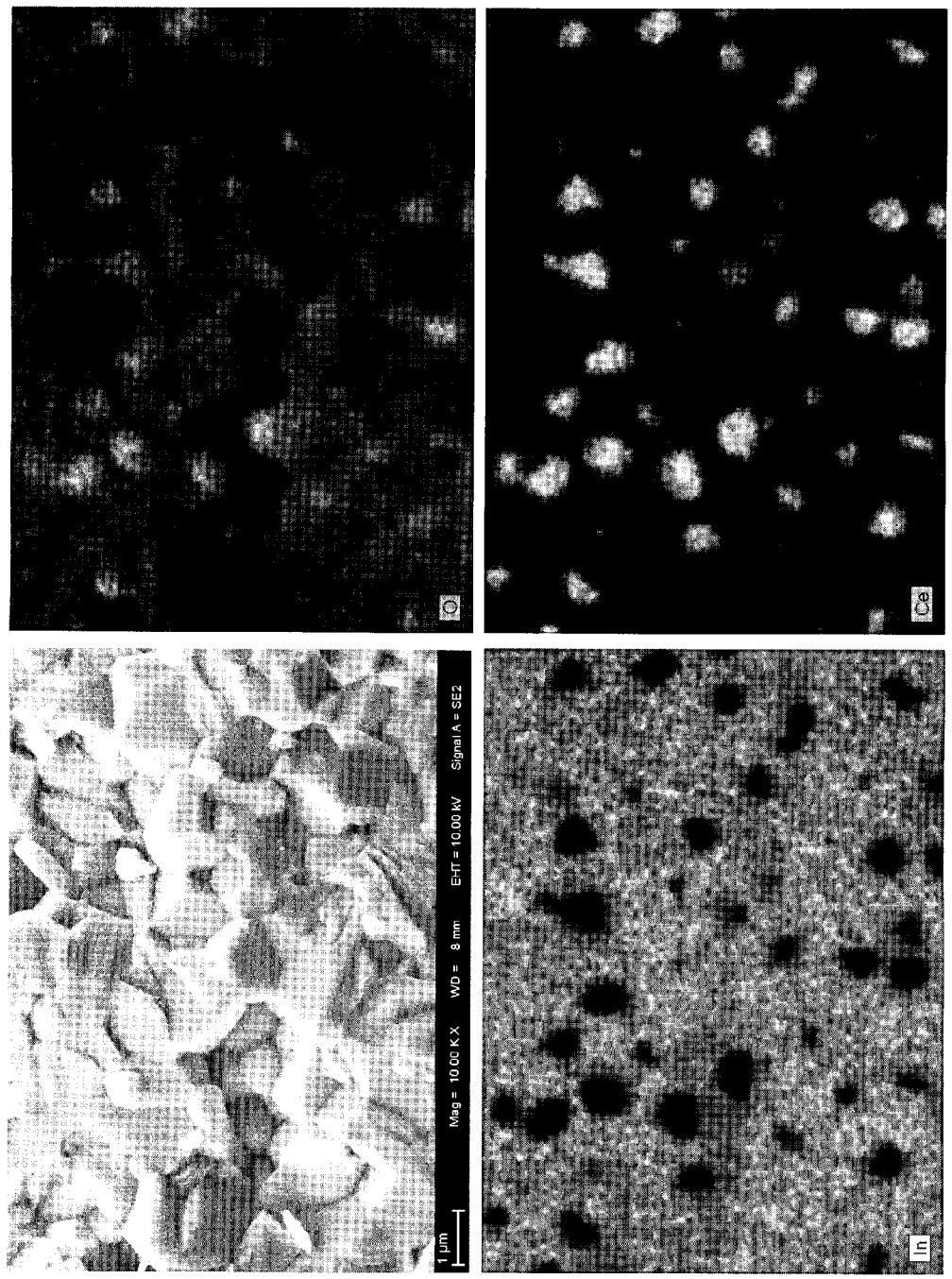
FIG. 1 is a photo showing a secondary electron image by a scanning electron microscope (SEM), and surface analysis result by an energy dispersive X-ray analysis method (EDS) of the cross-section of an oxide sintered body containing cerium in a content of 9% by atom, as an atomicity ratio of Ce/(In+Ce), as one example of an $In_2O_3$ phase of a main crystal phase, in which a crystal grain of a $CeO_2$ phase is finely dispersed.

Explanation will be given below in detail on the tablet for ion plating, the production method therefor and the transparent conductive film of the present invention, with reference to drawings.

1. An Oxide Sintered Body

In the present invention, there are largely classified into two kinds in the oxide sintered body containing indium and cerium as oxides: the one having a specific phase structure, where a content of cerium is the cerium content of 0.3 to 9% by atom, as an atomicity ratio of Ce/(In+Ce) (hereafter, this is referred to as a first oxide sintered body); and the one further containing the M element other than indium and cerium, wherein the cerium content of 0.3 to 9% by atom, as an atomicity ratio of Ce/(In+Ce+M), an M element content of equal to or lower than 1% by atom, as an atomicity ratio of M/(In+Ce+M), and a total content of cerium and M element of equal to or lower than 9% by atom, as an atomicity ratio of (Ce+M)/(In+Ce+M), and the M element is at least one or more kinds of an metal element selected from the metal element group consisting of titanium, zirconium, hafnium, molybdenum and tungsten (hereafter, this is referred to as a second oxide sintered body), and in the second oxide sintered body, it is preferable that the M element is titanium, which is hereafter referred to as a third oxide sintered body.

As described above, conventionally, a target for sputtering aiming at forming a transparent conductive film composed of oxides containing indium and cerium has been proposed, however, as for an ion plating method, because there has not been investigated sufficiently, as for the oxide sintered body containing indium and tin to be a material thereof, on the compositional phase and the texture, or optimization of density of said oxide sintered body, splash generation cannot be suppressed in obtaining the oxide sintered body by an ion plating method, and thus there was a difficult aspect to produce the transparent conductive film stably and in high rate. In the present invention, the oxide sintered body containing indium and cerium has been investigated in detail, in view of the compositional phase and the texture thereof, to clarify influence on film-formation rate of the oxide transparent conductive film, or on splash generation in film-formation by the ion plating method.

1) A First Oxide Sintered Body

The first oxide sintered body of the present invention contains indium and cerium as oxides, where the cerium content is 0.3 to 9% by atom, as an atomicity ratio of Ce/(In+Ce), and the $In_2O_3$ phase of a bixbyite structure is a main crystal phase, and a $CeO_2$ phase of a fluorite-type structure is finely dispersed, as a second phase, as crystal grains having an average particle diameter of equal to or smaller than 3 μm, and the density is 3.4 to 5.5 $g/cm^3$.

(a) Composition

As for the first oxide sintered body of the present invention, it is necessary that the cerium content is 0.3 to 9% by atom, as an atomicity ratio of Ce/(In+Ce), so that a crystalline transparent conductive film having low specific resistance and high refractive index is obtained, by an ion plating method.

In the case where the cerium content of the oxide sintered body is below 0.3% by atom, as an atomicity ratio of Ce/(In+Ce), carrier electrons minimum required are not generated in the transparent conductive film formed using this as a raw material, and is thus not preferable. For the transparent conductive film formed using the oxide sintered body as a raw material to show low specific resistance due to high mobility, it is necessary to generate a small amount of carrier electrons by doping of cerium, in addition to carrier electrons generated by oxygen deficiency. It should be noted that, because tin has extremely high generation effect of carrier electrons when added to indium oxide, tin should not be contained. It is not preferable to contain also elements such as silicon, germanium, antimony, bismuth and tellurium and the like, by the same reason, although the above effect thereof is a little inferior, as compared with tin. However, as for unavoidable impurities in an amount of such a degree as not to influence on the above characteristics, it does not apply.

On the other hand, in the case where cerium content of the oxide sintered body is over 9% by atom, as an atomicity ratio of Ce/(In+Ce), ratio of the $CeO_2$ phase of a fluorite-type structure dispersed in the oxide sintered body results in being increased, and the $CeO_2$ phase becomes to have higher electric resistance and lower film-formation rate, as compared with the $In_2O_3$ phase, and thus production efficiency decreases industrially. In addition, the excess addition of Ce increases specific resistance of the crystalline transparent conductive film formed, and makes it difficult to obtain equal to or lower than $8 \times 10^{-4}$ Ω·cm minimum required in using as a transparent electrode of a blue LED or a solar cell.

(b) A Generated Phase and a Form Thereof.

It is necessary that the first oxide sintered body of the present invention should have not only the above composition rage, but also the texture thereof should have the $In_2O_3$ phase of a bixbyite structure, as a main crystal phase, and the $CeO_2$ phase of a fluorite-type structure should be finely dispersed, as a second phase, as crystal grains having an average particle diameter of equal to or smaller than 3 μm.

In the $In_2O_3$ phase of a bixbyite structure as the main phase, cerium seldom makes a solid solution. On the other hand, indium seldom makes a solid solution also in the $CeO_2$ phase of a fluorite-type structure of a dispersed phase. However, in the both phases, a part of indium may be substituted with cerium in a non-equilibrium way, or a part of cerium may be substituted with indium, or there may be contained some shifts from a stoichiometric composition, metal element deficiency or oxygen deficiency.

In the above PATENT LITERATURE 3, there has been described that cerium, tin and titanium make a solid solution in an indium site of the $In_2O_3$ phase which is the oxide sintered body. Originally, cerium seldom makes a solid solution in the $In_2O_3$ phase, however, in the case of the PATENT LITERATURE 3, it is estimated that cerium becomes easy to make a solid solution due to containing mainly tin. In addition, also in the above PATENT LITERATUREs 1 and 2, it is estimated that cerium became easy to make a solid solution similarly, because tin or titanium is containing in relatively high compositional ratio as compared with cerium, in most Examples. However, in the case of adding cerium in such a large quantity as over the composition range of the present invention, it does not apply, and for example, a mixed oxide containing any of In, Ce, Sn and Ti may be formed as an another phase.

In addition, as for the oxide sintered body of the present invention, as described above, it is necessary that relation between the main phase of the $In_2O_3$ phase of a bixbyite structure, where cerium seldom makes a solid solution, and the $CeO_2$ phase of a fluorite-type structure of the second phase is expressed by an X-ray diffraction peak intensity ratio (I), defined by the following formula (1), and said X-ray diffraction peak intensity ratio is equal to or lower than 25%. In particular, it is preferable that the X-ray diffraction peak intensity ratio is equal to or lower than 20%. The X-ray diffraction peak intensity ratio over 25% generates splash frequently in film-formation by an ion plating method, and is thus not preferable.

$$I = [CeO_2 phase(111)/In_2O_3 phase(222)] \times 100 [\%] \quad (1)$$

It is necessary that the $CeO_2$ phase of a fluorite-type structure, as a second phase, is finely dispersed as crystal grains having an average particle diameter of equal to or smaller than 3 μm, and the average particle diameter of the crystal grain over 3 μm generates splash frequently in film-formation by an ion plating method, and is thus not preferable. It is more preferable that the average particle diameter of the crystal grain is equal to or smaller than 2 μm.

(c) A Sintered Body Texture and a Nodule

The oxide sintered body relevant to the present invention has a sintered body texture little generate splash in film-formation by an ion plating method.

In the case where the oxide sintered body containing indium and cerium as oxides is processed, for example, as a tablet for ion plating, crystal grains of the $In_2O_3$ phase of a main phase and the $CeO_2$ phase as the second phase are present at said tablet surface or inside, and there may be a case causing a problem of splash generation in the tablet surface or inside, depending on the crystal diameter and the dispersion state of $CeO_2$ phase among them. The $CeO_2$ phase has such characteristics that electric resistance is higher as compare with the $In_2O_3$ phase, and easily generates charge-up of charges caused by plasma beams or electron beams. A general oxide sintered body of ITO is composed of crystal grains of a coarse $In_2O_3$ phase with an average particle diameter of about 10 µm, where Sn makes a solid solution, however, in the case where the oxide sintered body containing indium and cerium as oxides within the above composition range is composed of coarse crystal grains in both of the $In_2O_3$ phase and the $CeO_2$ phase, similarly as the ITO sintered body, charge-up of crystal grains of the $CeO_2$ phase easily is generated, resulting in generation of splash.

In order to suppress charge-up of the crystal grain of the $CeO_2$ phase in this way, it is necessary to make a finer texture of the oxide sintered body containing indium and cerium, as an oxide, within the above composition range. That is, it is necessary to finely disperse the crystal grain of the $CeO_2$ phase in said oxide sintered body.

In FIG. 1, there are shown a secondary electron image by a scanning electron microscope (SEM), and surface analysis result by an energy dispersive X-ray analysis method (EDS) of the cross-section of the oxide sintered body containing cerium in a content of 9% by atom, as an atomicity ratio of Ce/(In+Ce), as an example of the $In_2O_3$ phase, as a main phase, finely dispersed with the crystal grain of the $CeO_2$ phase. Although not distinguishable in a secondary electron image at the upper left of the photo, in the surface analysis result of the lower right photo, the $In_2O_3$ phase as the main phase, and the $CeO_2$ phase as the second phase are clearly distinguished. This is considered that cerium little makes a solid solution in the $In_2O_3$ phase of a bixbyite structure, or indium little makes a solid solution also in the $CeO_2$ phase of a fluorite-type structure, which is a dispersed phase. Here, it has been confirmed that, in the crystal grain of the $CeO_2$ phase, there are many particles with an average particle diameter of 1 µm, satisfying a standard of an average particle diameter of equal to or smaller than 3 µm, and use of a target obtained by processing of this oxide sintered body little generates a nodule from a digging residue as a starting point in sputtering. In this way, as shown in FIG. 1, it is clear that a texture having the $In_2O_3$ phase as a main crystal phase, and the $CeO_2$ phase finely dispersed as a second phase, is effective in suppressing a nodule, which tends to be generated accompanying with progress of sputtering.

Figure 4:
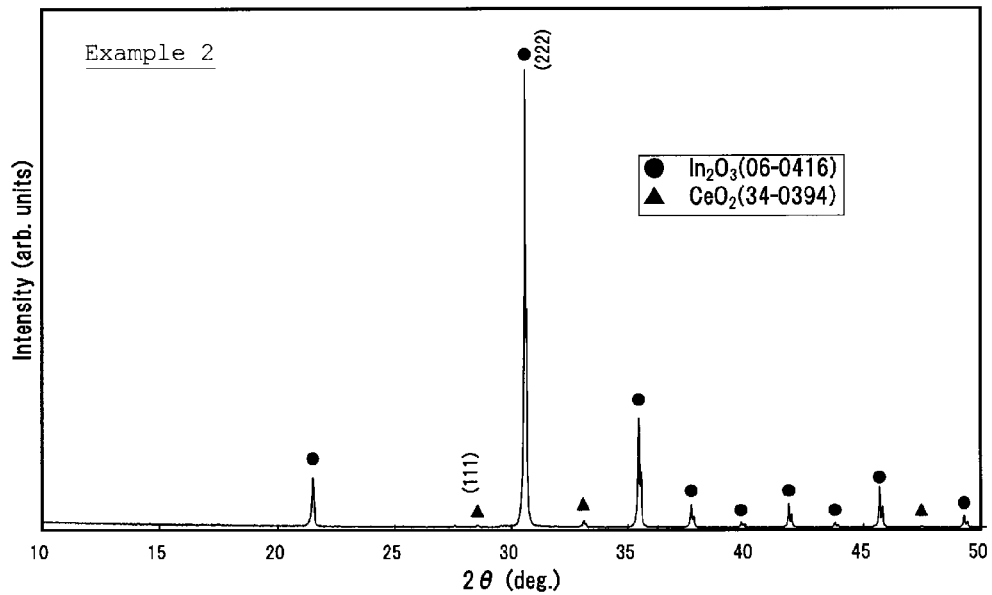
FIG. 4 is a photo showing a secondary electron image by a scanning electron microscope (SEM), and surface analysis result by an energy dispersive X-ray analysis method (EDS) of the cross-section of an oxide sintered body containing cerium in a content of 1% by atom, as an atomicity ratio of Ce/(In+Ce), as one example of an $In_2O_3$ phase of a main crystal phase, in which a crystal grain of a $CeO_2$ phase is finely dispersed.

In addition, in FIG. 4, with exemplifying the oxide sintered body containing cerium in a content of 1% by atom, as an atomicity ratio of Ce/(In+Ce), as an example of crystal grains of the $CeO_2$ phase finely dispersed in the $In_2O_3$ phase of a main crystal phase, there are shown a secondary electron image by a scanning electron microscope (SEM), and surface analysis result by an energy dispersive X-ray analysis method (EDS) of the cross-section of the oxide sintered body. Although not distinguishable in a secondary electron image at the upper left of the photo, in the surface analysis result of the lower right photo, the $In_2O_3$ phase as the main phase, and the $CeO_2$ phase as the second phase are clearly distinguished. This is considered that cerium little makes a solid solution in the $In_2O_3$ phase of a bixbyite structure, or indium little makes a solid solution also in the $CeO_2$ phase of a fluorite-type structure, as a dispersed phase.

Here, in the crystal grain of the $InO_3$ phase, the crystal grains with two kinds of particle diameters are confirmed. One kind thereof is a relatively small crystal grain with an average particle diameter of 1 µm, satisfying a standard of an average particle diameter of equal to or smaller than 2 µm, and the other kind thereof is a relatively large crystal grain with an average particle diameter of 3 µm, satisfying a standard of an average particle diameter of equal to or larger than 2.5 µm. The former is superior in sintering property, and contributes to secure strength of a sintered body by necking of crystal grains themselves or the like. On the other hand, the latter is inferior in sintering property, and is adjusted to density of the sintered body suitable as the tablet for ion plating, that is, contributes to make lower density. Therefore, by composing the $In_2O_3$ phase with these two kinds of crystal grains having different average particle diameters, securing of strength and adjustment of density (to make lower density) of a sintered body are attained. On the other hand, the crystal grain of the $CeO_2$ phase has many particles with an average particle diameter of equal to or smaller than 1 µm, satisfying a standard of an average particle diameter of equal to or smaller than 3 µm, and use of a tablet obtained by processing of this oxide sintered body little generates a splash caused by charge-up in film-formation by an ion plating method. In this way, as shown in FIG. 4, it is clear that the texture having the $In_2O_3$ phase as a main crystal phase, and the $CeO_2$ phase finely dispersed as a second phase, is effective to suppress splash caused by charge-up in film-formation by an ion plating method.

As described above, in order to suppress splash caused by charge-up, it is necessary that the average particle diameter of crystal grains composed of the $CeO_2$ phase is equal to or smaller than 3 µm, and still more it is preferable to be controlled at equal to or smaller than 2 µm. It should be noted that, in the case where the cerium content in the oxide sintered body is below 0.3% by atom, crystal grains of a fine $CeO_2$ phase become not to be dispersed uniformly, and splash suppression becomes not effective.

Similarly, in order to suppress splash caused by charge-up, it is necessary that the crystal grain of the $InO_3$ phase is composed of two kinds with different sizes, that is, a relatively small crystal grain with an average particle diameter of equal to or smaller than 2 µm, more preferably equal to or smaller than 1.5 µm, and still more preferably equal to or smaller than 1 µm, and a relatively large crystal grain with an average particle diameter of equal to or larger than 2.5 µm, more preferably 3 to 6 µm. In this way, by composing the $In_2O_3$ phase with crystal grains with two kinds of sizes, compatibility of both strength securing and density adjustment (to make lower density) of the sintered body becomes possible, and splash can be suppressed. It should be noted that trying to control the average particle diameter below 2.5 µm by increasing relatively small crystal grains results in difficulty of making lower density, that is, density becomes over 5.5 g/cm³. On the other hand, when size of the relatively large crystal grain becomes over 6 µm, density of the oxide sintered body becomes below 3.4 g/cm³ or strength of the sintered body is impaired, and thus splash suppression becomes difficult.

In this way, in the present invention, a dispersed state of the $CeO_2$ phase in the oxide sintered body is specified, as well as a composition ratio to the $In_2O_3$ phase is specified. The composition ratio of the $In_2O_3$ phase of a main crystal phase and the $CeO_2$ phase of a dispersed phase, in the oxide sintered body relevant to the present invention, has the X-ray diffraction peak intensity ratio (I), defined by the above formula (1), of equal to or lower than 25%.

In addition, in the present invention, strength is enhanced by making finer crystal grains composing the oxide sintered body. That is, the oxide sintered body becomes one difficult to fracture, even in receiving impact by heat or the like, by increasing power to be charged in ion plating.

2) The Second Oxide Sintered Body

The second oxide sintered body relevant to the present invention is characterized by further containing, in the first oxide sintered body, as an oxide, at least one or more kinds of an metal element (M element) selected from the metal element group consisting of titanium, zirconium, hafnium, molybdenum and tungsten, wherein the cerium content of 0.3 to 9% by atom, as an atomicity ratio of Ce/(In+Ce+M), an M element content of equal to or lower than 1% by atom, as an atomicity ratio of M/(In+Ce+M), and a total content of cerium and M element of equal to or lower than 9% by atom, as an atomicity ratio of (Ce+M)/(In+Ce+M).

The addition of cerium to the indium oxide-type transparent conductive film decreases generation effect of carrier electrons. However, in such applications where low specific resistance has priority than high refractive index, it is preferable to generate relatively more carrier electrons in the crystalline transparent conductive film. In this case, the addition of both cerium and the M element is more effective than the addition of only cerium.

When at least one or more kinds of the M metal element selected from the metal element group consisting of titanium, zirconium, hafnium, molybdenum and tungsten is further contained as an oxide of the M element, in the transparent conductive film containing indium and cerium, and M element content is equal to or lower than 1% by atom, as an atomicity ratio relative to total metal elements, generation effect of carrier electrons becomes several times high, as compared with cerium, and required amount of carrier electrons can be generated by only a trace amount of the addition. Because it is necessary to decrease the addition amount of cerium to compensate the addition of the M element, effect of more decreasing specific resistance can be obtained, although refractive index decreases a little. This effect is valid also in a combination of two or more kinds of elements selected from the above element group.

It should be noted that, because tin has far higher generation effect of carrier electrons, when added to indium oxide, as compared with the above M element, tin should not be contained. It is not preferable to contain also elements such as silicon, germanium, antimony, bismuth and tellurium, by the same reason, although the above effect thereof is a little inferior, as compared with tin. However, as for unavoidable impurities, it does not apply.

It is preferable that the second oxide sintered body in the present invention has a generation phase or a texture thereof similar to that of the first oxide sintered body. It should be noted that any of at least one or more kinds of the M metal element selected from the metal element group consisting of titanium, zirconium, hafnium, molybdenum and tungsten preferentially makes a solid solution in the $In_2O_3$ phase, however, there may also the case where it makes a solid solution also in the $CeO_2$ phase, when atomic ratio relative to total metal elements is over 1% by atom.

That is, the second oxide sintered body has, in the oxide sintered body containing, as an oxide, indium and cerium, and at least one or more kinds of an metal element selected from the metal element group consisting of titanium, zirconium, hafnium, molybdenum and tungsten, the cerium content of 0.3 to 9% by atom, as an atomicity ratio of Ce/(In+Ce+M), an M element content of equal to or lower than 1% by atom, as an atomicity ratio of M/(In+Ce+M), and a total content of cerium and at least one or more kinds of the M metal element selected from the above metal element group of equal to or lower than 9% by atom, as an atomicity ratio of (Ce+M)/(In+Ce+M)), where the $In_2O_3$ phase of a bixbyite structure is a main crystal phase, and the $CeO_2$ phase of a fluorite-type structure is finely dispersed as a second phase, as crystal grains having an average particle diameter of equal to or smaller than 3 μm, more preferably equal to or smaller than 2 μm, and the density is 3.4 to 5.5 g/cm³. It should be noted that the $In_2O_3$ phase is composed of two kinds of crystal grains having different sizes; that is, a relatively small crystal grain with an average particle diameter of equal to or smaller than 2 μm, more preferably equal to or smaller than 1.5 μm, and still more preferably equal to or smaller than 1 μm, and a relatively large crystal grain with an average particle diameter of equal to or larger than 2.5 μm, more preferably, and more preferably 3 to 6 μm.

3) A Third Oxide Sintered Body

The third oxide sintered body in the present invention corresponds to the case where titanium only is selected in the M metal element group. That is, in the oxide sintered body containing, as an oxide, indium, cerium and titanium, the cerium content of 0.3 to 9% by atom, as an atomicity ratio of Ce/(In+Ce+Ti), an titanium content of equal to or lower than 1% by atom, as an atomicity ratio of Ti/(In+Ce+Ti), and a total content of cerium and titanium of equal to or lower than 9% by atom, as an atomicity ratio of (Ce+Ti)/(In+Ce+Ti)), where the $In_2O_3$ phase of a bixbyite structure is a main crystal phase, and the $CeO_2$ phase of a fluorite-type structure is finely dispersed as a second phase, as crystal grains having an average particle diameter of equal to or smaller than 3 μm, and the density is 3.4 to 5.5 g/cm³. It should be noted that the $In_2O_3$ phase is composed of two kinds of crystal grains having different sizes; that is, a relatively small crystal grain with an average particle diameter of equal to or smaller than 2 μm, more preferably equal to or smaller than 1.5 μm, and still more preferably equal to or smaller than 1 μm, and a relatively large crystal grain with an average particle diameter of equal to or larger than 2.5 μm, more preferably, and more preferably 3 to 6 μm.

As described above, the addition of cerium to the indium oxide-type transparent conductive film decreases generation effect of carrier electrons. However, in such applications where low specific resistance has priority than high refractive index, it is preferable to generate relatively more carrier electrons in the crystalline transparent conductive film. In this case, the addition of both cerium and the titanium is more effective than the addition of only cerium. Titanium has generation effect of carrier electrons several times high, as compared with cerium, and required amount of carrier electrons can be generated by only a trace amount of the addition. Because it is necessary to decrease the addition amount of cerium to compensate the addition of titanium, specific resistance can be decreased effectively, although refractive index decreases a little.

It should be noted that, as described above, because tin has far higher generation effect of carrier electrons, as compared with titanium, tin should not be contained. It is not preferable to contain also elements such as silicon, germanium, antimony, bismuth and tellurium and the like, by the same reason, although the above effect thereof is a little inferior, as compared with tin.

From the above reason, it is preferable that the cerium content is 0.3 to 9% by atom, as an atomicity ratio of Ce/(In+Ce+Ti), the Ti content is equal to or lower than 1% by atom, as an atomicity ratio of Ti/(In+Ce+Ti), and the total content of cerium and titanium is equal to or lower than 9% by atom, as an atomicity ratio of (Ce+Ti)/(In+Ce+Ti). Reason for specifying cerium content as above is similar as in the first oxide sintered body.

The Ti content over 1% by atom, as an atomicity ratio of Ti/(In+Ce+Ti), provides too high carrier electron concentration in the crystalline transparent conductive film, causing decrease in refractive index, and is thus not preferable oppositely. Still more, in the oxide sintered body, titanium preferentially makes a solid solution in the $In_2O_3$ phase, however, there may also be the case where it makes a solid solution in the $CeO_2$ phase, when the amount is over 1% by atom. The $CeO_2$ phase increases conductivity, even in a reduced state, when titanium makes a solid solution. In addition, when total content of cerium and titanium is over 9% by atom, as an atomicity ratio of (Ce+Ti)/(In+Ce+Ti), because refractive index decreases similarly, mainly caused by increase in titanium content, and is thus not preferable. It should be noted that influence caused by increase in mainly cerium content is similar as in the first oxide sintered body.

It is preferable that in the third oxide sintered body relevant to the present invention, a generation phase or a texture thereof is similar as in the first oxide sintered body.

2. The Production Method for the Oxide Sintered Body

In the production method for the oxide sintered body relevant to the present invention, raw material powder containing indium oxide powder and cerium oxide powder is mixed, or into this raw material powder, further oxide powder of at least one or more kinds of the metal element selected from the M metal element group consisting of titanium, zirconium, hafnium, molybdenum and tungsten, preferably titanium oxide powder, is added and mixed, then the mixed powder is compacted, and the molding is sintered by a normal pressure sintering method. Alternatively, the above mixed powder is compacted by a hot press method and sintered.

Among the above raw material powder, the average particle diameter of the cerium oxide powder is set at equal to or smaller than 1.5 μm, and the oxide sintered body after sintering is subjected to heat treatment at temperature and for time sufficient to obtain the oxide sintered body, where the $In_2O_3$ phase of a bixbyite structure is a main crystal phase, and the $CeO_2$ phase of a fluorite-type structure is finely dispersed, as a second phase, as crystal grains having an average particle diameter of equal to or smaller than 3 μm. In this way, the oxide sintered body where the $In_2O_3$ phase of a bixbyite structure is a main crystal phase, and the $CeO_2$ phase of a fluorite-type structure is finely dispersed, as a second phase, as crystal grains having an average particle diameter of equal to or smaller than 3 μm, more preferably equal to or smaller than 2 μm, can be obtained.

Still more, in the case of production of the tablet for ion plating, it is effective to use indium oxide powder having two kinds of average particle diameters; that is, an average particle diameter of one kind thereof is set at equal to or smaller than 1.5 μm, and more preferably equal to or smaller than 1 μm, while an average particle diameter of the other kind thereof is set at equal to or larger than 2 μm, and more preferably 2 to 5 μm.

That is, performance of the oxide sintered body, having the above phase composition and a composition of each phase, largely depends on production condition of the oxide sintered body, for example, particle diameter of raw material powder, mixing condition and firing condition.

The oxide sintered body relevant to the present invention requires that the cerium oxide powder adjusted to have an average particle diameter of equal to or smaller than 1.5 μm is used, as raw material powder. In addition, in the case of the second and the third oxide sintered bodies, it is necessary to add oxide powder of at least one or more kinds of the M element selected from the M metal element group consisting of titanium, zirconium, hafnium, molybdenum and tungsten, particularly titanium oxide powder to raw material powder containing indium oxide powder and cerium oxide powder, and use as raw material powder.

As described above, by setting the average particle diameter of the cerium oxide powder at equal to or smaller than 1.5 μm, among raw material powder, it is possible to attain a texture of the oxide sintered body relevant to the present invention, which has the $In_2O_3$ phase of a bixbyite structure, as a main phase, where the second phase composed of the $CeO_2$ phase of a fluorite-type structure is present, however, crystal grains composed of the $CeO_2$ phase are finely and uniformly dispersed relative to the main phase, and have an average particle diameter of equal to or smaller than 3 μm. Still more, by adjusting cerium oxide powder so as to have an average particle diameter of equal to or smaller than 1 μm, it is possible to control average particle diameter of the crystal grain composed of the second $CeO_2$ phase to equal to or smaller than 2 μm.

When cerium oxide powder with the average particle diameter over 1.5 μm is used as raw material powder, the average particle diameter of the crystal grains composed of the $CeO_2$ phase, which is present in the resultant oxide sintered body, and the $In_2O_3$ phase as a main phase, becomes over 3 μm.

It should be noted that, in the case of production of the tablet for ion plating, it is effective to use indium oxide powder having two kinds of average particle diameters; that is, an average particle diameter of one kind thereof is set at equal to or smaller than 1.5 μm, and more preferably equal to or smaller than 1 μm, while an average particle diameter of the other kind thereof is set at equal to or larger than 2 μm, and more preferably 2 to 5 μm. Ratio of the one with relatively small average particle diameter and the one with relatively large average particle diameter is not especially limited, as long as density of a sintered body becomes 3.4 to 5.5 $g/cm^3$, however, for example, it may be set at 10:90 to 90:10, and preferably 30:70 to 70:30.

In NON-PATENT LITERATURE 2, there has been explained, as for sintering mechanism of ITO, that by increasing heating temperature raising speed of an ITO compact more than certain speed in sintering, time for generation of neck growth and particle growth, by evaporation • condensation mechanism or surface diffusion mechanism, where making a finer texture little progresses, can be shortened, and a temperature region of volume diffusion can be reached in a state that driving force of sintering is still maintained, therefore making a finer texture is progressed and sintering density is enhanced. In this case, inter-particle distance "d" before sintering, which corresponds to particle diameter of raw material powder, contracts to "d'", by mass transfer caused by volume diffusion during a sintering process. In this way, when limited to sintering of two particles of raw material powder, diameter of the crystal grain of the sintered body becomes "2d'". However, usually, because a plurality of particles of the same kinds of the oxides are adjacent, it is considered that diameter of the crystal grain of the sintered body is over "2d'", finally.

In the case where cerium little makes a solid solution in indium oxide, as in the present invention, it is important to decrease particle diameter of cerium oxide raw material powder, to decrease crystal grain diameter of the cerium oxide phase of the sintered body.

As described above, large crystal grains of the $CeO_2$ phase with the average particle diameter over 3 μm tends to be charged-up, thus causing splash, in the case of continued film-formation by the ion plating method.

Indium oxide powder is a raw material of ITO (indium-tin oxide), and development of fine indium oxide powder, having excellent sintering property, has been progressed with improvement of ITO. The raw material powder, with an average particle diameter of equal to or smaller than 1.5 µm, more preferably equal to or smaller than 1 µm, is easily available, as well as one with an average particle diameter over 1.5 µm, due to use in a large quantity also at present, as a raw material of ITO.

However, in the case of cerium oxide powder, suitable powder as raw material powder for producing the sintered body, that is, raw material powder with an average particle diameter of equal to or smaller than 1.5 µm, more preferably equal to or smaller than 1 µm, in a state utilizable as it is, without performing crushing or the like, is not easily available, due to smaller use quantity as compared with indium oxide powder. Therefore the coarse cerium oxide powder is required to be crushed to an average particle diameter of equal to or smaller than 1.5 µm, more preferably equal to or smaller than 1 µm.

In addition, also in the case of oxide powder of at least one or more kinds of an metal element selected from the metal element group composed of titanium, zirconium, hafnium, molybdenum and tungsten, to be added to obtain the second oxide sintered body, similarly as in the cerium oxide powders, it is difficult to obtain raw material powder with an average particle diameter of 1.5 µm, more preferably equal to or smaller than 1 µm, therefore it is required to crushed coarse oxide powder to an average particle diameter of 1.5 µm, more preferably equal to or smaller than 1 µm.

In order to obtain the oxide sintered body of the present invention, after mixing of raw material powder containing indium oxide powder and cerium oxide powder having the above average particle diameter, the mixed powder is compacted and the compact is sintered by a normal pressure sintering method, or the mixed powders are compacted and sintered by a hot press method. The normal pressure sintering method is a simple and convenient, and industrially advantageous method, and thus a preferable method, however, a hot press method may be used as well, if necessary.

1) The Normal Pressure Sintering Method

In the case where the normal pressure sintering method is used to obtain the oxide sintered body, a compact is prepared first. The above raw material powder is charged into a resin pot for mixing with a binder (for example, PVA is used) or the like, by using a wet-type ball mill or the like. In order to obtain the oxide sintered body, it is preferable that the above ball mill mixing is performed for 18 hours or longer. In this case, as a ball for mixing, a hard-type $ZrO_2$ ball may be used. After the mixing, slurry is taken out for performing of filtration, drying and granulation. After that, the resultant granulated substance is compacted, under a pressure of from about 9.8 MPa (0.1 ton/cm$^2$) to 294 MPa (3 ton/cm$^2$), by use of a cold isostatic press to obtain a compact.

In a sintering step of the normal pressure sintering method, heating is performed at a predetermined temperature range under atmosphere of oxygen presence. In order to obtain a tablet for ion plating, the compact is sintered at 1000 to 1200° C., for 10 to 30 hours, under atmosphere of oxygen presence, more preferably at 1000 to 1100° C., under atmosphere where oxygen gas is introduced into air inside a sintering furnace. Sintering time is preferably from 15 to 25 hours.

By use of the cerium oxide powder, which is adjusted to have the above average particle diameter of equal to or smaller than 1.5 µm, more preferably equal to or smaller than 1 µm, as raw material powder, and at the sintering temperature of the above range, it is possible to obtain a dense oxide sintered body, where the crystal grains made of the $CeO_2$ phase, having an average particle diameter of equal to or smaller than 3 µm, more preferably equal to or smaller than 2 µm, are finely dispersed in the $In_2O_3$ phase matrix.

It should be noted that, in the case of producing the tablet for ion plating of the present invention, having the density controlled at 3.4 to 5.5 g/cm$^3$, it is effective to use indium oxide powder having two kinds of average particle diameters; it is preferable that an average particle diameter of one kind among them is set at equal to or smaller than 1.5 µm, and more preferably equal to or smaller than 1 µm, while an average particle diameter of the other kind is set at equal to or larger than 2 µm, and more preferably 2 to 5 µm.

The too low sintering temperature does not progress a sintering reaction sufficiently. In particular, in order to obtain the oxide sintered body with a density of equal to or higher than 3.4 g/cm$^3$, the temperature is preferably equal to or higher than 1000° C. On the other hand, the sintering temperature over 1200° C. makes density of the oxide sintered body over 5.5 g/cm$^3$.

In PATENT LITERATURE 3, similarly as in PATENT LITERATUREs 1 an 2, because quite a large quantity of titanium or tin is added, in addition to indium and cerium, in a conventional technology, cerium makes a solid solution in the indium oxide phase, however, the present invention is characterized in that, because titanium addition amount is low, and tin is not contained, cerium does not make a solid solution in the indium oxide phase.

Sintering atmosphere is preferably atmosphere in the presence of oxygen, and still more preferably atmosphere where oxygen gas is introduced into air inside the sintering furnace. Presence of oxygen in sintering enables to make higher density of the oxide sintered body. In temperature increase up to sintering temperature, to prevent cracking of a sintered body and progress de-binder, it is preferable to set temperature increasing rate in a range of from 0.2 to 5° C./min. In addition, as needed, different temperature increasing rates may be combined to raise temperature up to sintering temperature. In the step for increasing temperature, specific temperature may be held for a certain period aiming at progressing of de-binder or sintering. In cooling after sintering, it is preferable to stop introduction of oxygen, and lower temperature down to 1000° C. at temperature decreasing rate in a range of from 0.2 to 5° C./min, in particular, 0.2° C./min to 1° C./min.

2) The Hot Press Method

In the present invention, in the case where the hot press method is adopted in producing the oxide sintered body, the mixed powder is compacted and sintered at 700 to 950° C. for 1 to 10 hours under a pressure of 2.45 to 29.40 MPa under inert gas atmosphere or in vacuum. The hot press method is capable of decreasing oxygen content in the sintered body, due to subjecting raw material powder of the oxide sintered body to compacting and sintering under reducing atmosphere, as compared with the above normal pressure sintering method. However, caution is required in compacting and sintering at a high temperature over 950° C., because of reduction of indium oxide and melting as metal indium.

Next, one Example of production condition in the case of obtaining the oxide sintered body relevant to the present invention by the hot press method is shown. That is, firstly, indium oxide powder and cerium oxide powder with an average particle diameter of equal to or smaller than 1.5 µm, more preferably equal to or smaller than 1 µm, or still more oxide powder of at least one or more kinds of the metal element selected from the metal element group consisting of titanium, zirconium, hafnium, molybdenum and tungsten, with an average particle diameter of equal to or smaller than 1.5 µm, more preferably equal to or smaller than 1 µm are prepared as raw material powder, so as to attain predetermined ratio. It should be noted that, in the case of producing the tablet for ion plating of the present invention, having the density controlled at 3.4 to 5.5 g/cm³, it is effective to use two kinds of indium oxide powder having the above average particle diameters of relatively small one and relatively large one; that is, an average particle diameter of one kind thereof is set at equal to or smaller than 1.5 µm, and more preferably equal to or smaller than 1 µm, while an average particle diameter of the other kind thereof is set at equal to or larger than 2 µm, and more preferably 2 to 5 µm.

The prepared raw material powder is sufficiently mixed similarly as in ball mill mixing of a normal pressure sintering method, preferably for a mixing time of 18 hours or longer. Then the granulated mixed powder is supplied into a carbon container to be subjected to sintering by the hot press method. Sintering temperature may be set at from 700 to 950° C., pressure may be set at from 2.45 MPa to 29.40 MPa (25 to 300 kgf/cm²), and sintering time may be set from about 1 to 10 hours. Atmosphere during hot press is preferably under inert gas such as Ar or the like, or in vacuum.

In the case of a obtaining of a target for ion plating, more preferably, sintering temperature may be set at from 700 to 800° C., pressure may be at from 2.45 MPa to 9.80 MPa (25 to 100 kgf/cm²), and sintering time may be from 1 to 3 hours.

3. The Tablet for Ion Plating

The tablet for ion plating is obtained by cutting the oxide sintered body relevant to the present invention to a predetermined size, and polishing processing of the surface.

It is required that the tablet for the ion plating is controlled to have a density of 3.4 to 5.5 g/cm³. The density below 3.4 g/cm³ provides inferior strength of a sintered body itself, and thus cracks or fractures easily is generated even for small and local thermal expansion. The density over 5.5 g/cm³ makes impossible to absorb stress or strain generated locally in charging plasma beams or electron beams, and cracks are generated easily, making difficult high rate film-formation. Preferable density is 3.8 to 5.3 g/cm³, and more preferable density is 4.0 to 5.0 g/cm³. In the present invention, by density adjustment (to make lower density) of the oxide sintered body, an opening (void) part becomes present in a tablet texture.

Diameter and thickness are not especially limited, however, it is required to has shape matching to an ion plating apparatus to be used. In general, circular cylinder shape is used well, and for example, the one having a diameter of 20 to 50 mm, and a height of about 30 to 100 mm is preferable.

4. The Transparent Conductive Film Containing Indium and Cerium, and a Film-Formation Method Thereof.

In the present invention, the mainly crystalline transparent conductive film is formed on a substrate, using the above oxide sintered body as the tablet for ion plating.

As the substrate, various plates or films may be used, such as glass, synthetic quartz, a synthetic resin such as PET or polyimide, a stainless steel plate, in response to applications. In particular, because heating is required in forming the crystalline transparent conductive film, the substrate having heat resistance is necessary.

In the ion plating method, increase in direct-current power to be charged has been performed generally to enhance film-formation rate of the transparent conductive film. As described above, in the first, the second and the third oxide sintered bodies relevant to the present invention, the $In_2O_3$ phase of a bixbyite structure is a main crystal phase, and the crystal grains of the $CeO_2$ phase as a second phase are uniformly and finely dispersed, having an average particle diameter of equal to or smaller than 3 µm, and more preferably equal to or smaller than 2 µm. Therefore, even when direct-current power to be charged is increased, charge-up can be suppressed and thus splash can be suppressed.

1) Film-Formation by the Ion Plating Method

In the ion plating method, using the tablet for ion plating (it may also be called the pellet) prepared from the above oxide sintered body, the transparent conductive film may be formed. In this case, the tablet for ion plating of the present invention obtained by processing the oxide sintered body with a density of 3.4 to 5.5 g/cm³, is used.

In an ion plating method, as described above, irradiation of electron beams or heat by arc discharge or the like onto a target to become an evaporation source, raises temperature locally at a part irradiated, by which particles are evaporated and deposited onto a substrate. In this case, evaporated particles are ionized by electron beams or arc discharge. There are various methods for ionization, however, a high density plasma assisted vapor deposition method (HDPE method) using a plasma generation apparatus (a plasma gun) is suitable for forming a transparent conductive film with good quality. In this method, arc discharge by using the plasma gun is utilized. Arc discharge is maintained between a built-in cathode in said plasma gun and an evaporation source crucible (anode). By introducing electrons emitted from the cathode into the crucible by magnetic field deflection, irradiation is concentrated locally onto the tablet charged in the crucible. By this electron beams, evaporation particles are evaporated from a locally high temperature part, and deposited onto the substrate. Because evaporation particles thus vaporized or $O_2$ gas introduced as reaction gas is ionized and activated inside this plasma, a transparent conductive film with good quality may be prepared.

In order to form the transparent conductive film, it is preferable to use mixed gas composed of inert gas and oxygen, in particular, argon and oxygen. In addition, it is preferable that inside the chamber of an apparatus is set at a pressure of 0.1 to 3 Pa, in particular, 0.2 to 2 Pa.

In the present invention, film-formation is possible at room temperature without heating of the substrate, however, the substrate may also be heated at from 50 to 500° C., in particular, from 250 to 500° C. For example, in the blue LED requiring a highly precise transparent electrode, to make lower resistance by once forming an amorphous transparent conductive film, and after performing patterning by wet etching using a weak acid, and by crystallization by heat treatment under non-oxidative atmosphere, it is better for the substrate in film-formation to be maintained at low temperature such as at the vicinity of room temperature. Other than the above, in a solar cell, because patterning by wet etching using a weak acid is not necessary, the crystalline transparent conductive film is formed by maintaining the substrate temperature at a high temperature of equal to or higher than 250° C. In addition, depending on applications, because the one with low melting point, such as a resin plate, a resin film is used as the substrate, it is desirable, in this case, to perform film-formation without heating.

2) The Transparent Conductive Film Obtained

In this way, by using the tablet for ion plating of the present invention, an amorphous or crystalline transparent conductive film superior in optical characteristics and conductivity can be produced on a substrate in relatively high film-formation rate by an ion plating method.

Composition of the resultant transparent conductive film becomes nearly equal to that of the tablet for ion plating. Film thickness is different depending on an application, however, 10 to 1000 nm may be attained. It should be noted that the amorphous transparent conductive film can be converted to a crystalline one by heating it at 300 to 500° C. for 10 to 60 minutes under inert gas atmosphere.

Specific resistance of the crystalline transparent conductive film was calculated from a product of surface resistance measured by a four-probe method using a resistivity meter, and film thickness, and is equal to or lower than $8 \times 10^{-4}$ Ω·cm. It should be noted that even when being amorphous, it is well possible that the specific resistance shows equal to or lower than $8 \times 10^{-4}$ Ω·cm. Carrier electron concentration and mobility thereof of the crystalline transparent conductive film are determined by hole effect measurement and the latter is equal to or higher than 35 $cm^2V^{-1}s^{-1}$. A generated phase of this film is identified by X-ray diffraction measurement, and found to be only the indium oxide phase, different from the oxide sintered body. In addition, refractive index is measured using a spectro-elipsometer, and is equal to or higher than 2.1 at a wavelength of 460 nm.

It should be noted that the crystalline or amorphous transparent conductive film formed by using the tablet for ion plating of the present invention is suitable for also applications not requiring low specific resistance and requiring only high refractive index, for example, an optical disk application and the like.

EXAMPLES

Explanation will be given below specifically on the present invention with reference to Examples and Comparative Examples, however, the present invention should not be limited thereto.

(Evaluation of the Oxide Sintered Body)

Using the mill ends, density of the oxide sintered body obtained was determined by the Archimedes' method. Subsequently a part of the mill ends was crushed to perform identification of generated phases of the resultant oxide sintered body by a powder method, with an X-ray diffraction apparatus (X'pert PRO MPD, manufactured by Philips Co., Ltd.). Then, X-ray diffraction peak intensity ratio (I), defined by the following formula, was determined:

$$I=[CeO_2 phase(111)/In_2O_3 phase(222)] \times 100[\%] \quad (1)$$

In addition, using a part of the powder, composition analysis of the oxide sintered body was performed by an ICP emission spectroscopy. Still more, with a scanning electron microscope, and an energy dispersive X-ray analysis method (SEM-EDS, ULTRA55, manufactured by Carl Zeiss Japan Co., Ltd., and QuanTax QX400, manufactured by Bulker Japan Cp., Ltd.), texture observation of the oxide sintered body, and surface analysis were performed. From the image analysis result of these images, average particle diameter of the crystal grains composed of the $CeO_2$ phase was determined.

(Evaluation of Fundamental Characteristics of the Transparent Conductive Film)

Composition of the resultant transparent conductive film was studied by an ICP emission spectroscopy. Film thickness of the transparent conductive film was measured with a surface roughness tester (Alpha-Step IQ, manufactured by Tencor Japan Corp.). Film-formation rate was calculated from film thickness and film-formation time. Specific resistance of the film was calculated from a product of surface resistance measured by a four-probe method using a resistivity meter (Loresta EP MCP-T360 model, manufactured by DIA Instruments Co., Ltd.), and film thickness. Carrier electron concentration of the film and mobility thereof were determined by hole effect measurement. A generated phase of the film was identified by X-ray diffraction measurement, similarly as in the oxide sintered body. In addition, refractive index was measured using a spectro-elipsometer (VASE, manufactured by J. A. Woolam Co., Ltd.), and in order to evaluate characteristics for, in particular, blue light, refractive index of a wavelength of 460 nm was compared.

Reference Example 1

Zinc oxide powders and cerium oxide powders were adjusted to have an average particle diameter of equal to or smaller than 1 μm to prepare raw material powders. These powders were formulated, so that content of gallium is 10% by atom as atom number ratio represented by Ce/(In+Ce), and charged in a pot made of a resin, together with water to mix in a wet-type ball mill. In this case, hard-type ZrO2 balls were used, and mixing time was set to 18 hours. After the mixing, slurry was taken out, filtered, dried and granulated. The granulated substances were converted to a compact under a pressure of 3 tons/$cm^2$, by using a cold isostatic press.

Then, the compact was sintered as follows. Sintering was performed under atmosphere by introduction of oxygen into a sintering furnace in a rate of 5 L/minute per 0.1 $m^3$ of furnace volume, at a sintering temperature of 1400° C. for 20 hours. In this case, temperature increasing rate was 1° C./minute, and in cooling after sintering, oxygen introduction was stopped, and temperature was cooled to 1000° C., at a rate of 10° C./minute.

The obtained oxide sintered body was processed to a size of 152 mm in diameter and 5 mm in thickness, and the sputtering surface thereof was polished by using a cup grinding stone so that Rz of maximal height becomes equal to or lower than 3.0 μm. The processed oxide sintered body was subjected to bonding to a backing plate made of oxygen-free copper using metal indium, to prepare a sputtering target.

Figure 2:
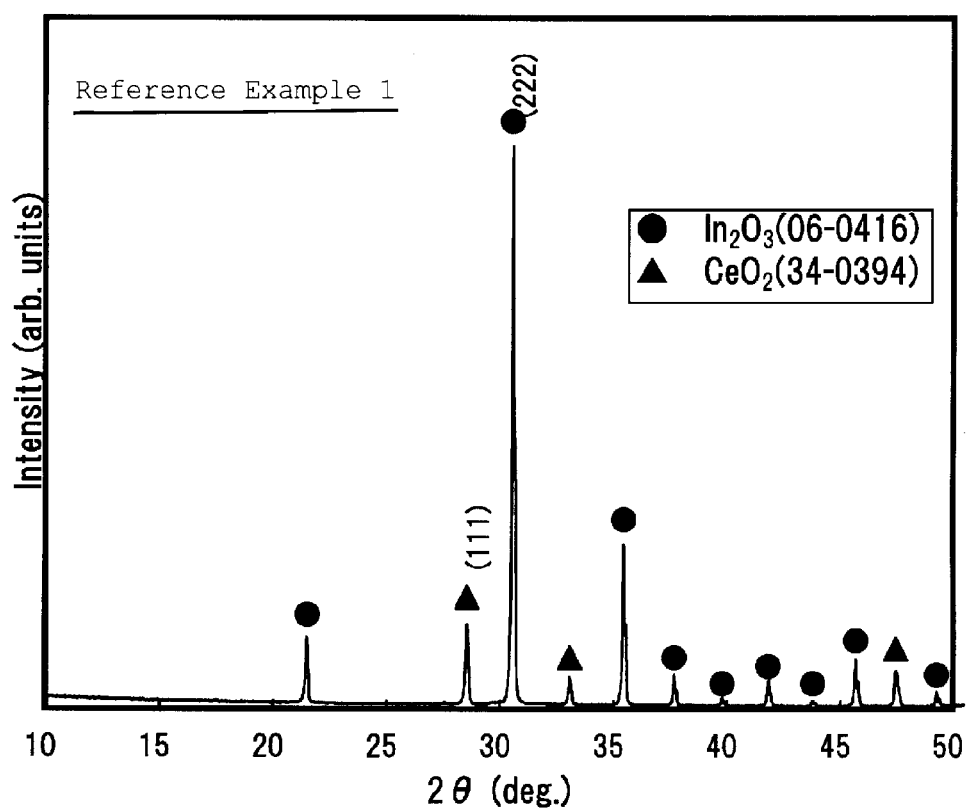
FIG. 2 is a chart showing an X-ray diffraction measurement result of the oxide sintered body of Reference Example 1, composed of an $In_2O_3$ phase of a bixbyite structure and a $CeO_2$ phase of a fluorite-type structure.

Composition analysis of the resultant oxide sintered body was performed by an ICP emission spectrometry, and it was confirmed to be nearly the same as charging composition in blending raw material powder. Next, as shown in FIG. 2, phase identification of the oxide sintered body was performed by X-ray diffraction measurement. From FIG. 2, it was confirmed to be composed of the $In_2O_3$ phase of a bixbyite-type structure, and the $CeO_2$ phase of a fluorite-type structure. X-ray diffraction peak intensity ratio of the $CeO_2$ phase (111), represented by the above equation (1), was 16%.

Density of the oxide sintered body was measured and found to be 6.87 g/$cm^3$. Subsequently, texture observation of the oxide sintered body was performed with SEM (refer to the above FIG. 1), and found that average particle diameter of the $CeO_2$ phase was 1.1 μm. These results are shown in Table 1.

Next, the sputtering target was attached to a cathode for a non-magnetic substance target of a direct-current magnetron sputtering apparatus (SPF-530H, manufactured by ANELVA Corp.) equipped with a direct-current power source not having arc-discharge suppression function. Synthesis quartz, with a size of 50 mm in side length and 0.5 mm in thickness, was used as a substrate, and distance between the target and the substrate was fixed to 49 mm. Mixed gas of argon and oxygen was introduced, so that ratio of oxygen was 1.0%, after vacuum exhausting to below $1 \times 10^{-4}$ Pa, to adjust gas pressure to 0.3 Pa. It should be noted that in the above ratio of oxygen of 1.0%, specific resistance exhibited the lowest value.

A direct-current power of 200 W (1.10 W/$cm^2$) was applied to generate direct-current plasma to perform sputtering. The direct-current sputtering was continued till attaining a cumulative charge power value of 12.8 KWh, which is calculated from a product of direct-current power charged and sputtering time. Arcing did not generate during this period, and discharge was stable. After completion of the sputtering, the target surface was observed and found no particular nodule generation. Then by changing direct-current power to 200, 400, 500 and 600 W (1.10 to 3.29 W/cm$^2$), sputtering was performed for 10 minutes under each power to measure arcing occurrence number of times. Under any power, arcing did not generate, and average arcing occurrence number of times per minute under each direct-current power was zero.

Subsequently, film-formation was performed by direct-current sputtering. After pre-sputtering for 10 minutes, the substrate was arranged just over the sputtering target, that is, at a stationary opposed position, and sputtering was performed at a substrate temperature of 500° C. to form a transparent conductive film with a film thickness of 200 nm. It was confirmed that the composition of the resultant transparent conductive film was nearly the same as that of the target.

By measurement of specific resistance of the film, it was found to be $6.6 \times 10^{-4}$ Ω·cm. In addition, measurement of hole effect was performed and found that carrier electron concentration was $2.6 \times 10^{20}$ cm$^{-3}$, and carrier electron mobility was 36 cm$^2$V$^{-1}$s$^{-1}$. Refractive index of a wavelength of 460 nm was 2.21. Crystallinity of the film was identified by X-ray diffraction measurement, and confirmed to be to be a crystalline film composed of an indium oxide phase only, and cerium to be in a solid solution state in the indium oxide phase.

Reference Example 2

An oxide sintered body and a sputtering target were prepared by a similar method as in Reference Example 1, except that raw material powder, adjusted to have an average particle diameter of equal to or smaller than 1.5 μm, was prepared, so that cerium content became 7% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 14%.

Density of the oxide sintered body was measured and found to be 6.88 g/cm$^3$. Subsequently, texture observation of the oxide sintered body was performed with SEM, and found that average particle diameter of the CeO$_2$ phase was 2.7 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 500° C. to form a transparent conductive film with a film thickness of 200 nm. It was confirmed that the composition of the resultant transparent conductive film was nearly the same as that of the target.

By measurement of specific resistance of the film, it was found to be $5.4 \times 10^{-4}$ Ω·cm. In addition, measurement of hole effect was performed and found that carrier electron concentration was $2.5 \times 10^{20}$ cm$^{-3}$, and carrier electron mobility was 46 cm$^2$V$^{-1}$s$^{-1}$. Refractive index of a wavelength of 460 nm was 2.20. Crystallinity of the film was identified by X-ray diffraction measurement, and confirmed to be to be a crystalline film composed of an indium oxide phase only, and cerium to be in a solid solution state in the indium oxide phase.

Reference Example 3

An oxide sintered body and a sputtering target were prepared by a similar method as in Reference Example 1, except that raw material powder, adjusted to have an average particle diameter of equal to or smaller than 1 μm, was prepared, so that cerium content became 5% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 9%.

Density of the oxide sintered body was measured and found to be 6.92 g/cm$^3$. Subsequently, texture observation of the oxide sintered body was performed with SEM, and found that average particle diameter of the CeO$_2$ phase was 1.3 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.6 \times 10^{-4}$ Ω·cm. In addition, measurement of hole effect was performed and found that carrier electron concentration was $2.4 \times 10^{20}$ cm$^{-3}$, and carrier electron mobility was 57 cm$^2$V$^{-1}$s$^{-1}$. Refractive index of a wavelength of 460 nm was 2.19. Crystallinity of the film was identified by X-ray diffraction measurement, and confirmed to be to be a crystalline film composed of an indium oxide phase only, and cerium to be in a solid solution state in the indium oxide phase.

Next, substrate temperature was set at room temperature (25° C.) to perform film-formation by a direct-current sputtering, and then heat treatment was performed under nitrogen.

By measurement of specific resistance of the film formed at room temperature, it was found to be $7.5 \times 10^{-4}$ Ω·cm. In addition, measurement of hole effect was performed and found that carrier electron concentration was $4.9 \times 10^{20}$ cm$^{-3}$, and carrier electron mobility was 17 cm$^2$V$^{-1}$s$^{-1}$. Refractive index of a wavelength of 460 nm was 2.17. Crystallinity of the film was identified by X-ray diffraction measurement, and confirmed to be to be an amorphous film.

Subsequently, heat treatment of this amorphous film was performed at 400° C. for 30 minutes under nitrogen atmosphere. As a result, specific resistance of the film was found to be $4.9 \times 10^{-4}$ Ω·cm. In addition, measurement of hole effect was performed and found that carrier electron concentration was $2.2 \times 10^{20}$ cm$^{-3}$, and carrier electron mobility was 58 cm$^2$V$^{-1}$s$^{-1}$. Refractive index of a wavelength of 460 nm was 2.20. Crystallinity of the film was identified by X-ray diffraction measurement, and confirmed to be to be a crystalline film composed of an indium oxide phase only, and cerium to be in a solid solution state in the indium oxide phase.

Reference Example 4

An oxide sintered body and a sputtering target were prepared by a similar method as in Reference Example 1, except that raw material powder, adjusted to have an average particle diameter of equal to or smaller than 1.5 μm, was prepared, so that cerium content became 4% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 8%.

Density of the oxide sintered body was measured and found to be 6.91 g/cm$^3$. Subsequently, texture observation of the oxide sintered body was performed with SEM, and found that average particle diameter of the CeO$_2$ phase was 2.8 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.2 \times 10^{-4}$ Ω·cm. In addition, measurement of hole effect was performed and found that carrier electron concentration was $2.3 \times 10^{20}$ cm$^{-3}$, and carrier electron mobility was 65 cm$^2$V$^{-1}$s$^{-1}$. Refractive index of a wavelength of 460 nm was 2.17. Crystallinity of the film was identified by X-ray diffraction measurement, and confirmed to be to be a crystalline film composed of an indium oxide phase only, and cerium to be in a solid solution state in the indium oxide phase.

Reference Example 5

An oxide sintered body and a sputtering target were prepared by a similar method as in Reference Example 1, except that raw material powder, adjusted to have an average particle diameter of equal to or smaller than 1 μm, was prepared, so that cerium content became 1% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 2%.

Density of the oxide sintered body was measured and found to be 6.86 g/cm$^3$. Subsequently, texture observation of the oxide sintered body was performed with SEM, and found that average particle diameter of the CeO$_2$ phase was 1.1 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $4.4 \times 10^{-4}$ Ω·cm. In addition, measurement of hole effect was performed and found that carrier electron concentration was $1.6 \times 10^{20}$ cm$^{-3}$, and carrier electron mobility was 88 cm$^2$V$^{-1}$s$^{-1}$. Refractive index of a wavelength of 460 nm was 2.14. Crystallinity of the film was identified by X-ray diffraction measurement, and confirmed to be to be a crystalline film composed of an indium oxide phase only, and cerium to be in a solid solution state in the indium oxide phase.

Reference Example 6

An oxide sintered body and a sputtering target were prepared by a similar method as in Reference Example 1, except that raw material powder, adjusted to have an average particle diameter of equal to or smaller than 1 μm, was prepared, so that cerium content became 0.3% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 0.5%.

Density of the oxide sintered body was measured and found to be 6.70 g/cm$^3$. Subsequently, texture observation of the oxide sintered body was performed with SEM, and found that average particle diameter of the CeO$_2$ phase was 1.2 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $7.6 \times 10^{-4}$ Ω·cm. In addition, measurement of hole effect was performed and found that carrier electron concentration was $1.0 \times 10^{20}$ cm$^{-3}$, and carrier electron mobility was 82 cm$^2$V$^{-1}$s$^{-1}$. Refractive index of a wavelength of 460 nm was 2.13. Crystallinity of the film was identified by X-ray diffraction measurement, and confirmed to be to be a crystalline film composed of an indium oxide phase only, and cerium to be in a solid solution state in the indium oxide phase.

Reference Example 7

An oxide sintered body and a sputtering target were prepared by a similar method as in Reference Example 1, except that raw material powder was obtained, by adjusting indium oxide powder, cerium oxide powder and titanium oxide powder to have an average particle diameter of equal to or smaller than 1.5 μm, so that cerium content became 8% by atom, as atom number ratio represented by Ce/(In+Ce+Ti), and titanium content became 1% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 25%.

Density of the oxide sintered body was measured and found to be 7.06 g/cm$^3$. Subsequently, texture observation of the oxide sintered body was performed with SEM, and found that average particle diameter of the CeO$_2$ phase was 2.7 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $5.6 \times 10^{-4}$ Ω·cm. In addition, measurement of hole effect was performed and found that carrier electron concentration was $3.1 \times 10^{20}$ cm$^{-3}$, and carrier electron mobility was 36 cm$^2$V$^{-1}$s$^{-1}$. Refractive index of a wavelength of 460 nm was 2.14. Crystallinity of the film was identified by X-ray diffraction measurement, and confirmed to be to be a crystalline film composed of an indium oxide phase only, and cerium to be in a solid solution state in the indium oxide phase.

Reference Example 8

An oxide sintered body and a sputtering target were prepared by a similar method as in Reference Example 1, except that raw material powder was obtained, by adjusting indium oxide powder, cerium oxide powder and titanium oxide powder to have an average particle diameter of equal to or smaller than 1 μm, so that cerium content became 5% by atom, as atom number ratio represented by Ce/(In+Ce+Ti), and titanium content became 0.5% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 14%.

Density of the oxide sintered body was measured and found to be 7.01 g/cm$^3$. Subsequently, texture observation of the oxide sintered body was performed with SEM, and found that average particle diameter of the CeO$_2$ phase was 1.5 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be $5.4 \times 10^{-4}$ Ω·cm. In addition, measurement of hole effect was performed and found that carrier electron concentration was $2.5 \times 10^{20}$ cm$^{-3}$, and carrier electron mobility was 46 cm$^2$V$^{-1}$s$^{-1}$. Refractive index of a wavelength of 460 nm was 2.17. Crystallinity of the film was identified by X-ray diffraction measurement, and confirmed to be to be a crystalline film composed of an indium oxide phase only, and cerium to be in a solid solution state in the indium oxide phase.

Reference Example 9

An oxide sintered body and a sputtering target were prepared by a similar method as in Reference Example 1, except that raw material powder was obtained, by adjusting indium oxide powder, cerium oxide powder and titanium oxide powder to have an average particle diameter of equal to or smaller than 1 μm, so that cerium content became 4% by atom, as atom number ratio represented by Ce/(In+Ce+Ti), and titanium content became 1% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 7%.

Density of the oxide sintered body was measured and found to be 7.06 g/cm$^3$. Subsequently, texture observation of the oxide sintered body was performed with SEM, and found that average particle diameter of the CeO$_2$ phase was 1.1 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 400° C. to form a transparent conductive film with a film thickness of 200 nm. It was confirmed that the composition of the resultant transparent conductive film was nearly the same as that of the target.

By measurement of specific resistance of the film, it was found to be 5.0×10$^{-4}$ Ω·cm. In addition, measurement of hole effect was performed and found that carrier electron concentration was 2.5×10$^{20}$ cm$^{-3}$, and carrier electron mobility was 50 cm$^2$V$^{-1}$s$^{-1}$. Refractive index of a wavelength of 460 nm was 2.16. Crystallinity of the film was identified by X-ray diffraction measurement, and confirmed to be to be a crystalline film composed of an indium oxide phase only, and cerium to be in a solid solution state in the indium oxide phase.

Reference Example 10

An oxide sintered body and a sputtering target were prepared by a similar method as in Reference Example 1, except that raw material powder was obtained, by adjusting indium oxide powder, cerium oxide powder and titanium oxide powder to have an average particle diameter of equal to or smaller than 1 μm, so that cerium content became 0.3% by atom, as atom number ratio represented by Ce/(In+Ce+Ti), and titanium content became 0.3% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 1%.

Density of the oxide sintered body was measured and found to be 7.05 g/cm$^3$. Subsequently, texture observation of the oxide sintered body was performed with SEM, and found that average particle diameter of the CeO$_2$ phase was 1.0 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be 5.0×10$^{-4}$ Ω·cm. In addition, measurement of hole effect was performed and found that carrier electron concentration was 1.5×10$^{20}$ cm$^{-3}$, and carrier electron mobility was 83 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium to be in a solid solution state in the indium oxide phase.

Reference Example 11

An oxide sintered body and a sputtering target were prepared by a similar method as in Reference Example 1, except that raw material powder was obtained, by adjusting indium oxide powder, cerium oxide powder and zirconium oxide powder to have an average particle diameter of equal to or smaller than 1 μm, so that cerium content became 0.3% by atom, as atom number ratio represented by Ce/(In+Ce+Zr), and zirconium content became 0.3% by atom, as atom number ratio represented by Zr/(In+Ce+Zr).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 1%.

Density of the oxide sintered body was measured and found to be 6.98 g/cm$^3$. Subsequently, texture observation of the oxide sintered body was performed with SEM, and found that average particle diameter of the CeO$_2$ phase was 1.0 μm.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be 5.2×10$^{-4}$ Ω·cm. In addition, measurement of hole effect was performed and found that carrier electron concentration was 1.5×10$^{20}$ cm$^{-3}$, and carrier electron mobility was 80 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium and zirconium to be in a solid solution state in the indium oxide phase.

It should be noted that nearly the same result was obtained, also in the case where hafnium, molybdenum or tungsten was added in the same composition, instead of zirconium.

Reference Comparative Example 1

An oxide sintered body and a sputtering target were prepared by a similar method as in Reference Example 1, except that raw material powder adjusted to have an average particle diameter of equal to or smaller than 1.5 μm, was prepared, so that cerium content became 1% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure.

Density of the oxide sintered body was measured and found to be 6.74 g/cm³. Subsequently, texture observation of the oxide sintered body was performed with SEM, and such an aspect was observed as quite a small quantity of the $CeO_2$ phase was scattered about. Average particle diameter of the $CeO_2$ phase was 1.0 μm. These results are shown in Table 1.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was shown a high value of $1.3 \times 10^{-3}$ Ω·cm. In addition, measurement of hole effect was performed and found that carrier electron concentration was $6.2 \times 10^{-19}$ cm$^{-3}$, and carrier electron mobility was 68 cm$^2$V$^{-1}$s$^{-1}$. Refractive index of a wavelength of 460 nm was 2.12. Crystallinity of the film was identified by X-ray diffraction measurement, and confirmed to be to be a crystalline film composed of an indium oxide phase only, and cerium to be in a solid solution state in the indium oxide phase.

Reference Comparative Example 2

An oxide sintered body and a sputtering target were prepared by a similar method as in Reference Example 1, except that raw material powder, adjusted to have an average particle diameter of equal to or smaller than 1.5 μm, was prepared, so that cerium content became 11% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase of a bixbyite-type structure, and the $CeO_2$ phase of a fluorite-type structure. X-ray diffraction peak intensity ratio of the $CeO_2$ phase (111), represented by the above equation (1), was as high as 28%.

Density of the oxide sintered body was measured and found to be 6.69 g/cm³. Subsequently, texture observation of the oxide sintered body was performed with SEM, and found that average particle diameter of the $CeO_2$ phase was 2.6 μm. In addition, such an aspect was observed as crystal grains of the $In_2O_3$ phase were converted to a little fine size, which was estimated to be caused by increase in volume ratio of crystal grains of the $CeO_2$ phase. It is considered that, in this way, X-ray diffraction peak intensity ratio of the $CeO_2$ phase (111), expressed by the above formula (1), became high.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 500° C. to form a transparent conductive film with a film thickness of 200 nm. It was confirmed that the composition of the resultant transparent conductive film was nearly the same as that of the target.

By measurement of specific resistance of the film, it was found as high as $1.0 \times 10^{-3}$ Ω·cm. In addition, measurement of hole effect was performed and found that carrier electron concentration was $2.8 \times 10^{20}$ cm$^{-3}$, and carrier electron mobility was 21 cm$^2$V$^{-1}$s$^{-1}$. Refractive index of a wavelength of 460 nm was 2.18. Crystallinity of the film was identified by X-ray diffraction measurement, and confirmed to be to be a crystalline film composed of an indium oxide phase only, and cerium to be in a solid solution state in the indium oxide phase.

Reference Comparative Example 3

An oxide sintered body and further a sputtering target were prepared by a similar method as in Reference Example 1, except that, cerium oxide powder with an average particle diameter of 2 μm was used as raw material powder.

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase of a bixbyite-type structure, and the $CeO_2$ phase of a fluorite-type structure. X-ray diffraction peak intensity ratio of the $CeO_2$ phase (111), represented by the above equation (1), was 18%.

Density of the oxide sintered body was measured and found to be 6.72 g/cm³. Subsequently, texture observation of the oxide sintered body was performed with SEM, and found that average particle diameter of the $CeO_2$ phase was 4.2 μm.

Figure 3:
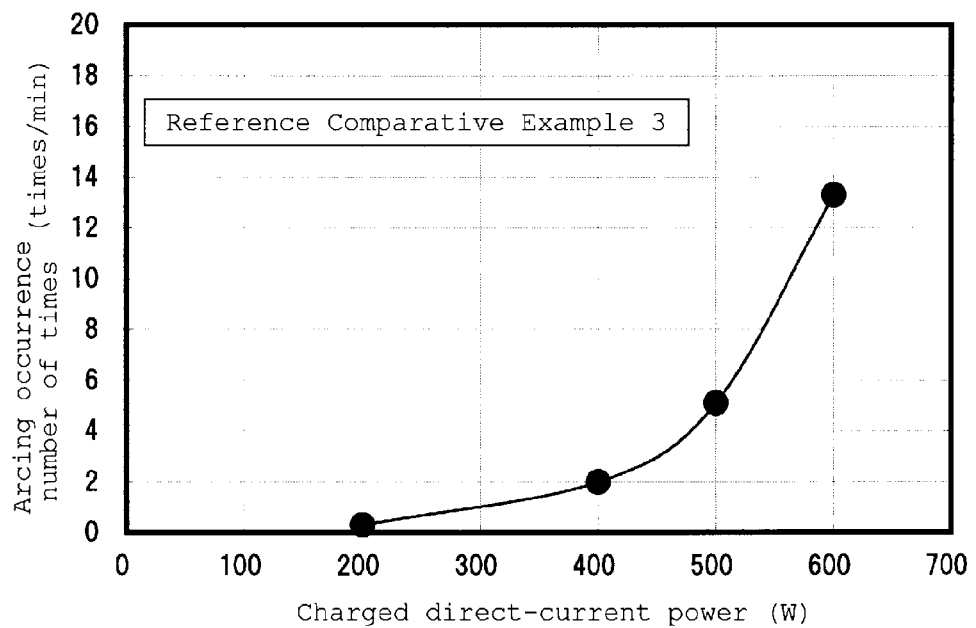
FIG. 3 is a graph showing an arcing generation state in sputtering using the oxide sintered body of Reference Comparative Example 3.

Next, by a similar method as in Reference Example 1, arcing occurrence was studied in direct-current sputtering. Direct-current sputtering was performed till attaining a cumulative charge power value of 12.8 KWh. Arcing did not generate for a while after starting the sputtering, however, after elapsing of a cumulative time for 11.2 kWh, arcing generated increasingly. In addition, in the case of changing direct-current power, arcing occurrence number of times per minute under each direct-current power was zero. After attaining the cumulative time, the target surface was observed to confirm generation of many nodules. Subsequently, by changing direct-current power to 200, 400, 500 and 600 W, sputtering was performed for 10 minutes under each power to measure arcing occurrence number of times. In FIG. 3, average arcing occurrence number of times per minute at each direct-current power was shown, together with Reference Comparative Example 2. From FIG. 3, it is clear that arcing generated frequently with increase in direct-current power. It should be noted that film-formation was not performed because of frequent occurrence of arcing.

Reference Comparative Example 4

An oxide sintered body and a sputtering target were prepared by a similar method as in Reference Example 1, except that raw material powder was obtained, by adjusting indium oxide powder, cerium oxide powder and titanium oxide powder to have an average particle diameter of equal to or smaller than 1 μm, so that cerium content became 0.3% by atom, as atom number ratio represented by Ce/(In+Ce+Ti), and titanium content became 3% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and the diffraction peak derived from only the $In_2O_3$ phase of a bixbyite-type structure was observed, and the diffraction peak derived from the $CeO_2$ phase of a fluorite-type structure was not observed. Density of the oxide sintered body was measured and found to be 7.04 g/cm$^3$.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $3.0 \times 10^{-4}$ Ω·cm. In addition, measurement of hole effect was performed and found that carrier electron concentration was $5.6 \times 10^{20}$ cm$^{-3}$, and carrier electron mobility was 37 cm$^2$V$^{-1}$s$^{-1}$. Refractive index of a wavelength of 460 nm was as low as 2.07. Crystallinity of the film was identified by X-ray diffraction measurement, and confirmed to be to be a crystalline film composed of an indium oxide phase only, and cerium and titanium to be in a solid solution state in the indium oxide phase.

Reference Comparative Example 5

An oxide sintered body and a sputtering target were prepared by a similar method as in Reference Example 1, except that raw material powder was obtained, by adjusting indium oxide powder, cerium oxide powder and tin oxide powder to have an average particle diameter of equal to or smaller than 1 μm, so that cerium content became 0.3% by atom, as atom number ratio represented by Ce/(In+Ce+Sn), and tin content became 3% by atom, as atom number ratio represented by Sn/(In+Ce+Sn).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and the diffraction peak derived from only the $In_2O_3$ phase of a bixbyite-type structure was observed, and the diffraction peak derived from the $CeO_2$ phase of a fluorite-type structure was not observed. Density of the oxide sintered body was measured and found to be 7.09 g/cm$^3$.

Next, by a similar method as in Reference Example 1, arcing occurrence was studied in direct-current sputtering. Arcing did not generate till attaining a cumulative charge power value of 12.8 KWh, and discharge was stable. In addition, in the case of changing direct-current power, arcing occurrence number of times per minute under each direct-current power was zero.

Subsequently, film-formation was performed by direct-current sputtering, similarly as in Reference Example 1. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $2.6 \times 10^{-4}$ Ω·cm. In addition, measurement of hole effect was performed and found that carrier electron concentration was $7.3 \times 10^{20}$ cm$^{-3}$, and carrier electron mobility was 33 cm$^2$V$^{-1}$s$^{-1}$. Refractive index of a wavelength of 460 nm was as low as 2.04. Crystallinity of the film was identified by X-ray diffraction measurement, and confirmed to be to be a crystalline film composed of an indium oxide phase only, and cerium and tin to be in a solid solution state in the indium oxide phase.

Example 1

Film-formation was performed by an ion plating method using a tablet composed of an oxide sintered body having a cerium content of 2% by atom, as an atomicity ratio represented by Ce/(In+Ce).

A method for preparing the oxide sintered body was nearly the same as in the case of the target for sputtering of Reference Example 1, including blending raw material powder adjusted so as to attain an average particle diameter of equal to or smaller than 1 μm, however, as described above, in the case of using as the tablet for ion plating, it is necessary to decrease density, therefore, it was decided to use indium oxide powder having two kinds of average particle diameters, and selected indium oxide powder adjusted to have an average particle diameter of 3 μm, in addition to the above indium oxide powder adjusted to have an average particle diameter of equal to or smaller than 1 μm.

Similarly, firing temperature was set at 1100° C. to decrease density. The tablet was compacted in advance so as to attain dimension after sintering of a diameter of 30 mm and a height of 40 mm. Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of the $In_2O_3$ phase of a bixbyite-type structure, and the $CeO_2$ phase of a fluorite-type structure. X-ray diffraction peak intensity ratio of the $CeO_2$ phase (111), represented by the above equation (1), was 4%. Density of the oxide sintered body was measured and found to be 4.67 g/cm$^3$. Subsequently, texture observation of the oxide sintered body was performed with SEM, and found that average particle diameter of the $CeO_2$ phase was 1.0 μm.

Discharge was continued, using a plasma gun by an ion plating method, using such an oxide sintered body as the tablet, until the tablet became not usable. As an ion plating apparatus, a reactive plasma vapor deposition apparatus was used, where high density plasma assisted vacuum vapor deposition method (HDPE method) was applicable. As film-formation condition, distance between an evaporation source and a substrate was set at 0.6 m, discharge current of the plasma gun at 100 A, Ar flow rate at 30 sccm, and $O_2$ flow rate at 10 sccm. A problem of splash or the like did not occur during a period until the tablet became not usable.

After replacing the tablet, film-formation was performed. It should be noted that substrate temperature was set at 300° C. to form a transparent conductive film with a film thickness of 200 nm. It was confirmed that the composition of the resultant transparent conductive film was nearly the same as that of the target.

By measurement of specific resistance of the film, it was found to be $3.3 \times 10^{-4}$ Ω·cm. In addition, measurement of hole effect was performed and found that carrier electron concentration was $2.1 \times 10^{20}$ cm$^{-3}$, and carrier electron mobility was 92 cm$^2$V$^{-1}$s$^{-1}$. Refractive index of a wavelength of 460 nm was 2.13. Crystallinity of the film was identified by X-ray diffraction measurement, and confirmed to be a crystalline film composed of an indium oxide phase only, and cerium was confirmed to be in a solid solution state in the indium oxide phase.

Example 2

A tablet was prepared from an oxide sintered body similarly as in example 1, except that raw material powder was prepared so that a cerium content is 1% by atom, as an atomicity ratio represented by Ce/(In+Ce). Composition analysis of the resultant tablet was performed by an ICP emission spectrometry, and it was confirmed to be nearly the same as charging composition in blending raw material powder.

Density of the tablet was measured and found to be 4.58 g/cm$^3$. In addition, X-ray diffraction peak intensity ratio of the CeO$_2$ phase (111), represented by the above equation (1), was 1%.

Figure 5:
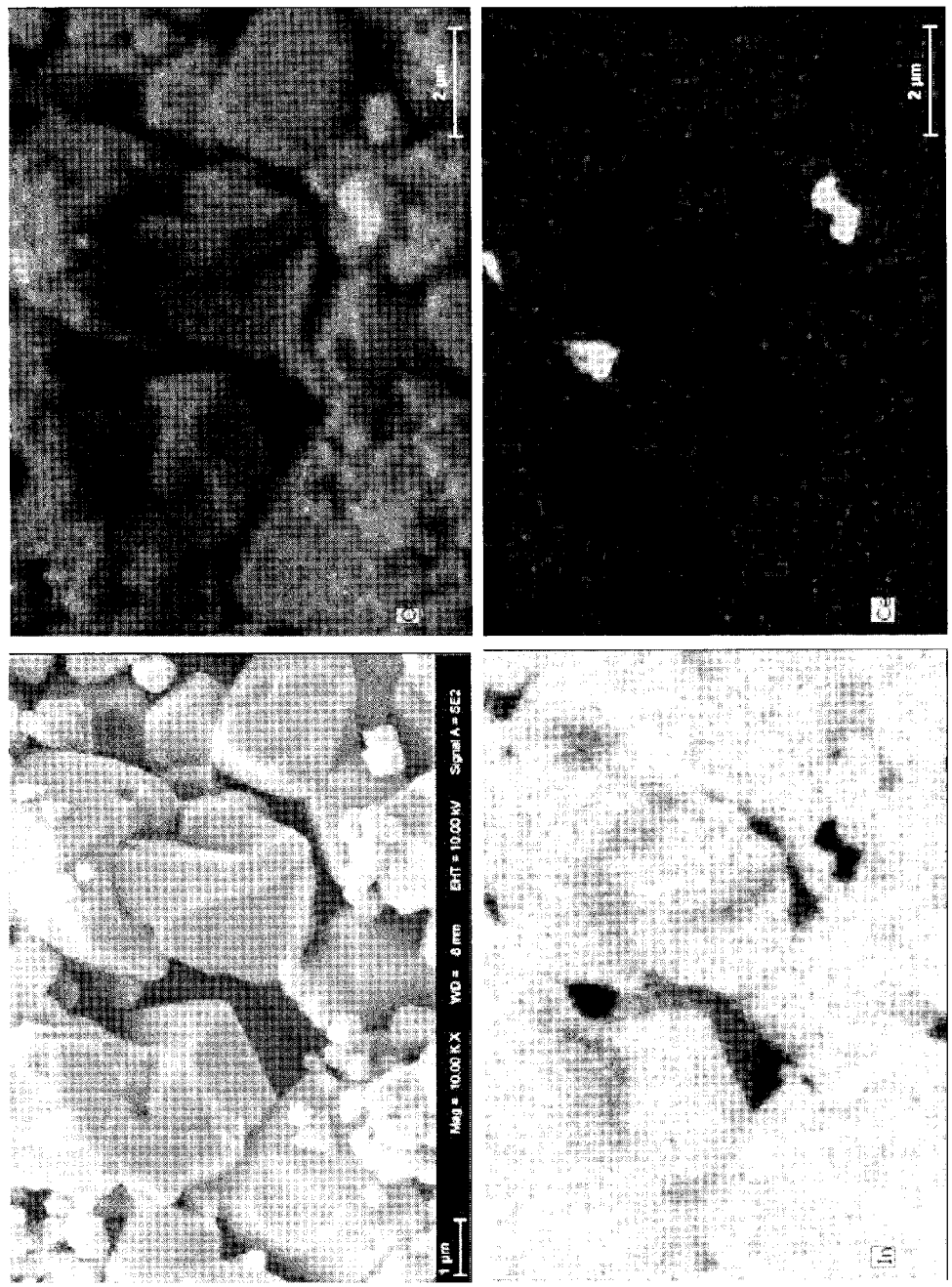
FIG. 5 is a chart showing an X-ray diffraction measurement result of the oxide sintered body of Example 2, composed of an $In_2O_3$ phase of a bixbyite structure and a $CeO_2$ phase of a fluorite-type structure.

Composition analysis of the resultant oxide sintered body was performed by an ICP emission spectrometry, and it was confirmed to be nearly the same as charging composition in blending raw material powder. Next, as shown in FIG. 5, phase identification of the oxide sintered body was performed by X-ray diffraction measurement. As shown in FIG. 5, it was confirmed that the oxide sintered body was composed of the In$_2$O$_3$ phase of a bixbyite-type structure, and the CeO$_2$ phase of a fluorite-type structure. X-ray diffraction peak intensity ratio of the CeO$_2$ phase (111), represented by the above equation (1), was 1%.

Subsequently, texture observation of the oxide sintered body was performed with SEM (refer to the above FIG. 4), and found that average particle diameter of the CeO$_2$ phase was 1.0 μm. These results are shown in Table 1.

Film-formation was performed by an ion plating method similarly as in Example 1, using this tablet.

Substrate temperature was set at 400° C. to form a transparent conductive film with a film thickness of 200 nm. It was confirmed that the composition of the resultant transparent conductive film was nearly the same as that of the tablet. A problem of splash or the like was not occurred, until the tablet became not usable.

By measurement of specific resistance of the film, it was found to be $3.6 \times 10^{-4}$ Ω·cm. In addition, measurement of hole effect was performed and found that carrier electron concentration was $2.1 \times 10^{20}$ cm$^{-3}$, and carrier electron mobility was 83 cm$^2$V$^{-1}$s$^{-1}$. Refractive index of a wavelength of 460 nm was 2.14. Crystallinity of the film was identified by X-ray diffraction measurement, and confirmed to be to be a crystalline film composed of an indium oxide phase only, and cerium to be in a solid solution state in the indium oxide phase.

Example 3

A tablet composed of an oxide sintered body was prepared similarly as in example 1, except that raw material powder was prepared so that a cerium content is 9% by atom, as an atomicity ratio represented by Ce/(In+Ce), and average particle diameter of cerium oxide powder among raw material powder was adjusted to be equal to or smaller than 1.5 μm. Composition analysis of the resultant tablet was performed by an ICP emission spectrometry, and it was confirmed to be nearly the same as charging composition in blending raw material powder. Density of the tablet was measured and found to be 4.88 g/cm$^3$. Subsequently, texture observation of the oxide sintered body was performed with SEM, and found that average particle diameter of the CeO$_2$ phase was 2.6 μm. In addition, X-ray diffraction peak intensity ratio of the CeO$_2$ phase (111), represented by the above equation (1), was 24%. Film-formation was performed similarly as in Example 1, using this tablet.

Substrate temperature was set at 400° C. to form a transparent conductive film with a film thickness of 200 nm. It was confirmed that the composition of the resultant transparent conductive film was nearly the same as that of the tablet. A problem of splash or the like was not occurred, until the tablet became not usable.

By measurement of specific resistance of the film, it was found to be $5.8 \times 10^{-4}$ Ω·cm. In addition, measurement of hole effect was performed and found that carrier electron concentration was $2.7 \times 10^{20}$ cm$^{-3}$, and carrier electron mobility was 40 cm$^2$V$^{-1}$s$^{-1}$. Refractive index of a wavelength of 460 nm was 2.20. Crystallinity of the film was identified by X-ray diffraction measurement, and confirmed to be to be a crystalline film composed of an indium oxide phase only, and cerium to be in a solid solution state in the indium oxide phase.

Example 4

A tablet composed of an oxide sintered body was prepared similarly as in Example 1, except that raw material powder was prepared so that a cerium content is 0.3% by atom, as an atomicity ratio represented by Ce/(In+Ce). Composition analysis of the resultant tablet was performed by an ICP emission spectrometry, and it was confirmed to be nearly the same as charging composition in blending raw material powder. Density of the tablet was measured and found to be 4.52 g/cm$^3$. Subsequently, texture observation of the oxide sintered body was performed with SEM, and found that average particle diameter of the CeO$_2$ phase was 1.0 μm. In addition, X-ray diffraction peak intensity ratio of the CeO$_2$ phase (111), represented by the above equation (1), was 0.5%.

Film-formation was performed similarly as in Example 1, using this tablet.

Substrate temperature was set at 300° C. to form a transparent conductive film with a film thickness of 200 nm. It was confirmed that the composition of the resultant transparent conductive film was nearly the same as that of the tablet. A problem of splash or the like was not occurred, until the tablet became not usable.

By measurement of specific resistance of the film, it was found to be $6.5 \times 10^{-4}$ Ω·cm. In addition, measurement of hole effect was performed and found that carrier electron concentration was $1.2 \times 10^{20}$ cm$^{-3}$, and carrier electron mobility was 80 cm$^2$V$^{-1}$s$^{-1}$. Refractive index of a wavelength of 460 nm was 2.13. Crystallinity of the film was identified by X-ray diffraction measurement, and confirmed to be to be a crystalline film composed of an indium oxide phase only, and cerium to be in a solid solution state in the indium oxide phase.

Example 5

A tablet composed of an oxide sintered body was prepared similarly as in Example 1, except that raw material powder was prepared so that cerium content became 4% by atom, as atom number ratio represented by Ce/(In+Ce+Ti), and titanium content became 1% by atom, as atom number ratio represented by Ti/(In+Ce+Ti). Composition analysis of the resultant oxide sintered body was performed by an ICP emission spectrometry, and it was confirmed to be nearly the same as charging composition in blending raw material powder.

In addition, X-ray diffraction peak intensity ratio of the $CeO_2$ phase (111), represented by the above equation (1), was 6%. Subsequently, texture observation of the oxide sintered body was performed with SEM, and found that average particle diameter of the $CeO_2$ phase was 1.2 μm. Density of the tablet was measured and found to be 4.84 g/cm$^3$. Film-formation was performed similarly as in Example 1, using this tablet.

Substrate temperature was set at 300° C. to form a transparent conductive film with a film thickness of 200 nm. It was confirmed that the composition of the resultant transparent conductive film was nearly the same as that of the tablet. A problem of splash or the like was not occurred, until the tablet became not usable.

By measurement of specific resistance of the film, it was found to be $3.9 \times 10^{-4}$ Ω·cm. In addition, measurement of hole effect was performed and found that carrier electron concentration was $2.9 \times 10^{20}$ cm$^{-3}$, and carrier electron mobility was 55 cm$^2$V$^{-1}$s$^{-1}$. Refractive index of a wavelength of 460 nm was 2.15. Crystallinity of the film was identified by X-ray diffraction measurement, and confirmed to be to be a crystalline film composed of an indium oxide phase only, and cerium to be in a solid solution state in the indium oxide phase.

Comparative Example 1

An oxide sintered body and a tablet for ion plating were prepared by a similar method as in Example 1, except that raw material powder, adjusted to have an average particle diameter of equal to or smaller than 1 μm, was prepared, so that cerium content became 0.1% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure.

Density of the oxide sintered body was measured and found to be 4.49 g/cm$^3$. Subsequently, texture observation of the oxide sintered body was performed with SEM, and such an aspect was observed as quite a small quantity of the $CeO_2$ phase was scattered about. Average particle diameter of the $CeO_2$ phase was 1.0 μm. These are shown in Table 1

Next, by a similar method as in Reference Example 1, film-formation was performed by an ion plating method, to study a splash occurrence state, and a problem of splash or the like was not occurred, until the tablet became not usable.

Subsequently, similarly as in Example 1, film-formation was performed by an ion plating method. It should be noted that substrate temperature was set at 300° C. to form a transparent conductive film with a film thickness of 200 nm. It was confirmed that the composition of the resultant transparent conductive film was nearly the same as that of the tablet.

By measurement of specific resistance of the film, showing as high value as $1.2 \times 10^{-3}$ Ω·cm. In addition, measurement of hole effect was performed and found that carrier electron concentration was $6.9 \times 10^{20}$ cm$^{-3}$, and carrier electron mobility was 75 cm$^2$V$^{-1}$s$^{-1}$. Refractive index of a wavelength of 460 nm was 2.11. Crystallinity of the film was identified by X-ray diffraction measurement, and confirmed to be to be a crystalline film composed of an indium oxide phase only, and cerium to be in a solid solution state in the indium oxide phase.

Comparative Example 2

An oxide sintered body and a tablet for ion plating were prepared by a similar method as in Example 1, except that raw material powder, adjusted to have an average particle diameter of equal to or smaller than 1.5 μm, was prepared, so that cerium content became 11% by atom, as atom number ratio represented by Ce/(In+Ce).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure, and the $CeO_2$ phase of a fluorite-type structure. X-ray diffraction peak intensity ratio of the $CeO_2$ phase (111), represented by the above equation (1), was as high as 28%.

Density of the oxide sintered body was measured and found to be 4.86 g/cm$^3$. Subsequently, texture observation of the oxide sintered body was performed with SEM, and found that average particle diameter of the $CeO_2$ phase was 2.7 μm.

Next, by a similar method as in Example 1, film-formation was performed by an ion plating method, to study a splash occurrence state, and a problem of splash or the like was not occurred, until the tablet became not usable.

Subsequently, similarly as in Example 1, film-formation was performed by an ion plating method. It should be noted that substrate temperature was set at 500° C. to form a transparent conductive film with a film thickness of 200 nm. It was confirmed that the composition of the resultant transparent conductive film was nearly the same as that of the tablet.

By measurement of specific resistance of the film, showing as high value as $1.1 \times 10^{-3}$ Ω·cm. In addition, measurement of hole effect was performed and found that carrier electron concentration was $2.9 \times 10^{20}$ cm$^{-3}$, and carrier electron mobility was 20 cm$^2$V$^{-1}$s$^{-1}$. Refractive index of a wavelength of 460 nm was 2.18. Crystallinity of the film was identified by X-ray diffraction measurement, and confirmed to be to be a crystalline film composed of an indium oxide phase only, and cerium to be in a solid solution state in the indium oxide phase.

Comparative Example 3

An oxide sintered body and a tablet for ion plating were prepared by a similar method as in Example 2, except that cerium oxide powder with an average particle diameter of 2 μm was used as raw material powder.

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure, and the $CeO_2$ phase of a fluorite-type structure. X-ray diffraction peak intensity ratio of the $CeO_2$ phase (111), represented by the above equation (1), was as high as 2%.

Density of the oxide sintered body was measured and found to be 4.61 g/cm$^3$. Subsequently, texture observation of the oxide sintered body was performed with SEM, and found that average particle diameter of the $CeO_2$ phase was 4.0 μm.

Next, by a similar method as in Example 1, film-formation was performed by an ion plating method, to study a splash occurrence state, and found that splash generated frequently with elapse of film-formation time. It should be noted that film-formation was not performed because of frequent occurrence of splash.

Comparative Example 4

An oxide sintered body and a tablet for ion plating were prepared similarly as in Example 5, except that raw material powder was prepared so that cerium content became 0.3% by atom, as atom number ratio represented by Ce/(In+Ce+Ti), and titanium content became 3% by atom, as atom number ratio represented by Ti/(In+Ce+Ti).

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure, and the diffraction peak derived from only the $In_2O_3$ phase of a bixbyite-type structure was observed, and the diffraction peak derived from the $CeO_2$ phase of a fluorite-type structure was not observed. Density of the oxide sintered body was measured and found to be 4.55 g/cm$^3$.

Next, by a similar method as in Example 1, film-formation was performed by an ion plating method, to study a splash occurrence state, and a problem of splash or the like was not occurred, until the tablet became not usable.

Subsequently, similarly as in Example 1, film-formation was performed by an ion plating method. It should be noted that substrate temperature was set at 300° C. to form a transparent conductive film with a film thickness of 200 nm. It was confirmed that the composition of the resultant transparent conductive film was nearly the same as that of the tablet.

By measurement of specific resistance of the film, showing as high value as $2.7 \times 10^{-4}$ Ω·cm. In addition, measurement of hole effect was performed and found that carrier electron concentration was $5.9 \times 10^{20}$ cm$^{-3}$, and carrier electron mobility was 39 cm$^2$V$^{-1}$s$^{-1}$. Refractive index of a wavelength of 460 nm was as low as 2.06. Crystallinity of the film was identified by X-ray diffraction measurement, and confirmed to be to be a crystalline film composed of an indium oxide phase only, and cerium and titanium to be in a solid solution state in the indium oxide phase.

Comparative Example 5

An oxide sintered body and a tablet for ion plating were prepared similarly as in Example 1, except that raw material powder was obtained by blending so that cerium content became 0.3% by atom, as atom number ratio represented by Ce/(In+Ce+Sn), and tin content became 3% by atom, as atom number ratio represented by Sn/(In+Ce+Sn), and average particle diameter of tin oxide powder became equal to or smaller than 1 μm.

Composition analysis of the resultant oxide sintered body was performed by an ICP emission spectrometry, and it was confirmed to be nearly the same as charging composition in blending raw material powder. Next, phase identification of the oxide sintered body was performed by X-ray diffraction measurement, and confirmed to be composed of only the $In_2O_3$ phase of a bixbyite-type structure, and the diffraction peak derived from only the $In_2O_3$ phase of a bixbyite-type structure was observed, and the diffraction peak derived from the $CeO_2$ phase of a fluorite-type structure was not observed. Density of the oxide sintered body was measured and found to be 4.61 g/cm$^3$.

Next, by a similar method as in Example 1, film-formation was performed by an ion plating method, to study a splash occurrence state, and a problem of splash or the like was not occurred, until the tablet became not usable.

Subsequently, similarly as in Example 1, film-formation was performed by an ion plating method. It should be noted that substrate temperature was set at 300° C. to form a transparent conductive film with a film thickness of 200 nm. It was confirmed that the composition of the resultant transparent conductive film was nearly the same as that of the tablet.

By measurement of specific resistance of the film, showing as high value as $2.4 \times 10^{-4}$ Ω·cm. In addition, measurement of hole effect was performed and found that carrier electron concentration was $8.7 \times 10^{20}$ cm$^{-3}$, and carrier electron mobility was 30 cm$^2$V$^{-1}$s$^{-1}$. Refractive index of a wavelength of 460 nm was as low as 2.02. Crystallinity of the film was identified by X-ray diffraction measurement, and confirmed to be to be a crystalline film composed of an indium oxide phase only, and cerium and tin to be in a solid solution state in the indium oxide phase.

TABLE 1

| | Ce/(In + Ce) (% by atom) | M element | Ce/(In + Ce + M) (% by atom) | M/(In + Ce + M) (% by atom) | Main phase of sintered body | Second phase of sintered body | $CeO_2$ phase (111)/$In_2O_3$ phase (222) | Average particle diameter of $CeO_2$ phase (μm) | Sintered body density (g/cm$^3$) | Splash (arcing) | Refractive index | Remark |
|---|---|---|---|---|---|---|---|---|---|---|---|---|
| Reference Example 1 | 9 | — | — | — | bixbyite-type | Fluorite-type | 16% | 1.1 | 6.87 | None | 2.21 | Sputtering |
| Reference Example 2 | 7 | — | — | — | $In_2O_3$ phase | $CeO_2$ phase | 14% | 2.7 | 6.88 | | 2.20 | |
| Reference Example 3 | 5 | — | — | — | | | 9% | 1.3 | 6.92 | | 2.19 | |
| Reference Example 4 | 4 | — | — | — | | | 8% | 2.8 | 6.91 | | 2.17 | |
| Reference Example 5 | 1 | — | — | — | | | 2% | 1.1 | 6.86 | | 2.14 | |

TABLE 1-continued

| | Ce/(In + Ce) (% by atom) | M element | Ce/(In + Ce + M) (% by atom) | M/(In + Ce + M) (% by atom) | Main phase of sintered body | Second phase of sintered body | CeO$_2$ phase (111)/In$_2$O$_3$ phase (222) | Average particle diameter of CeO$_2$ phase (µm) | Sintered body density (g/cm$^3$) | Splash (arcing) | Refractive index | Remark |
|---|---|---|---|---|---|---|---|---|---|---|---|---|
| Reference Example 6 | 0.3 | — | — | — | | | 0.5% | 1.2 | 6.70 | | 2.13 | |
| Reference Example 7 | — | Ti | 8 | 1 | | | 25% | 2.7 | 7.06 | | 2.14 | |
| Reference Example 8 | — | Ti | 5 | 0.5 | | | 14% | 1.5 | 7.01 | | 2.17 | |
| Reference Example 9 | — | Ti | 4 | 1 | | | 7% | 1.1 | 7.06 | | 2.16 | |
| Reference Example 10 | — | Ti | 0.3 | 0.3 | | | 1% | 1.0 | 7.05 | | 2.12 | |
| Reference Example 11 | — | Zr | 0.3 | 0.3 | | | 1% | 1.0 | 6.98 | | 2.12 | |
| Reference Comparative Example 1 | 0.1 | — | — | — | | | — | 1.0 | 6.74 | | 2.12 | |
| Reference Comparative Example 2 | 11 | — | — | — | | | 28% | 2.6 | 6.69 | | 2.18 | |
| Reference Comparative Example 3 | 9 | — | — | — | | | 18% | 4.2 | 6.72 | Yes | — | |
| Reference Comparative Example 4 | — | Ti | 0.3 | 3 | | | — | — | 7.04 | None | 2.07 | |
| Reference Comparative Example 5 | — | Sn | 0.3 | 3 | | | — | — | 7.09 | | 2.04 | |
| Example 1 | 2 | — | — | — | | | 4% | 1.0 | 4.67 | | 2.13 | Ion plating |
| Example 2 | 1 | — | — | — | | | 1% | 1.0 | 4.58 | | 2.14 | |
| Example 3 | 9 | — | — | — | | | 24% | 2.6 | 4.88 | | 2.20 | |
| Example 4 | 0.3 | — | — | — | | | 0.5% | 1.0 | 4.52 | | 2.13 | |
| Example 5 | — | Ti | 4 | 1 | | | 6% | 1.2 | 4.84 | | 2.15 | |
| Comparative Example 1 | 0.1 | — | — | — | | | — | 1.0 | 4.49 | | 2.11 | |
| Comparative Example 2 | 11 | — | — | — | | | 28% | 2.7 | 4.86 | | 2.18 | |
| Comparative Example 3 | 9 | — | — | — | | | 2% | 4.0 | 4.61 | Yes | — | |
| Comparative Example 4 | — | Ti | 0.3 | 3 | | | — | — | 4.55 | None | 2.06 | |
| Comparative Example 5 | — | Sn | 0.3 | 3 | | | — | — | 4.61 | | 2.02 | |

(Evaluation)

From the result shown in Table 1, it was clarified that the oxide sintered bodies of Examples 1 to 5 have a cerium content in the oxide sintered body of 0.3 to 9% by atom, as an atomicity ratio of Ce/(In+Ce), wherein the In$_2$O$_3$ phase of a bixbyite structure is a main crystal phase, the CeO$_2$ phase of a fluorite-type structure is finely dispersed, as a second phase, as crystal grains having an average particle diameter of equal to or smaller than 3 µm, and thus in continuous discharge for a long period of time by an ion plating method (an HDPE method) using these oxide sintered bodies as a tablet, splash caused by the CeO$_2$ phase was not generated. Still more, it was clarified that a crystal grain of the CeO$_2$ phase having two kinds of sizes of average particle diameters, wherein one kind is a relatively small crystal grain having the average particle diameter of equal to or smaller than 2 µm, more preferably equal to or smaller than 1.5 µm, and still more preferably equal to or smaller than 2 µm, and the other kind is a relatively large crystal grain having the average particle diameter of equal to or larger than 2.5 µm, and more preferably 3 to 6 µm, contributed to secure strength and adjust density (to make lower density of a sintered body), resulting in no generation of splash. In addition, density of the sintered body was in a range of 3.4 to 5.5 g/cm$^3$, showing suitable density to make little cracking caused by thermal shock, as the tablet. It should be noted that the crystalline transparent conductive films formed in Examples 1 to 5 were confirmed to show superior electrical and optical characteristics.

On the contrary, in Reference Examples 1 to 6, the oxide sintered bodies (the first oxide sintered bodies) composed of an indium oxide and a cerium oxide were prepared, by using indium oxide powder and cerium oxide powder adjusted to have an average particle diameter of equal to or smaller than 1.5 µm, to blend in a range of a cerium content of 0.3 to 9% by atom, as an atomicity ratio of Ce/(In+Ce), and it was confirmed that the oxide sintered bodies had a sintered body texture having the In$_2$O$_3$ phase of a bixbyite structure, as a main crystal phase, and a CeO$_2$ phase of a fluorite-type structure is finely dispersed as a second phase, as crystal grains having an average particle diameter of equal to or smaller than 3 µm. Still more, it was confirmed that as for relation between particle diameter and a dispersed state of the crystal grains of the In$_2$O$_3$ phase and the CeO$_2$ phase, X-ray diffraction peak intensity ratio of the CeO$_2$ phase (111) relative to the In$_2$O$_3$ phase (222) is equal to or lower than 25%.

In addition, in Reference Examples 7 to 11, the oxide sintered bodies (the second oxide sintered bodies) were prepared, which contained indium, cerium and the M element as oxides, by using the indium oxide powder and the cerium oxide powder adjusted to have an average particle diameter of equal to or smaller than 1.5 μm, and oxide powder of at least one or more kinds of the M element selected from the metal element group consisting of titanium, zirconium, hafnium, molybdenum and tungsten, and blending in a range of the cerium content of 0.3 to 9% by atom, as an atomicity ratio of Ce/(In+Ce), an M element content of equal to or lower than 1% by atom, as an atomicity ratio of M/(In+Ce+M), and a total content of cerium and M element of equal to or lower than 9% by atom, as an atomicity ratio of (Ce+M)/(In+Ce+M); and also the oxide sintered bodies (the third oxide sintered bodies) having titanium as the M element, and it was confirmed that they had a finely dispersed texture similar to that of the oxide sintered bodies of Reference Examples 1 to 6.

The oxide sintered bodies of Reference Examples 1 to 11 all showed such high density as a density of the sintered body of equal to or higher than 6.3 g/cm$^3$. When these oxide sintered bodies were used as a sputtering target to perform direct-current sputtering, it was clarified that, even after continuous sputtering for a long period of time, generation of a nodule started from a digging residue of sputtering caused by the $CeO_2$ phase was not observed, and even when direct-current power was changed within a range of 200 to 600 W, arcing did not generate.

It was confirmed that specific resistance of crystalline transparent conductive films formed in Reference Examples 1 to 11 was as good as equal to or lower than $8\times10^{-4}$ Ω·cm, and this low specific resistance depends on high carrier electron mobility over 35 cm$^2$V$^{-1}$s$^{-1}$. At the same time, as for optical characteristics, it was confirmed that, because of suppression of the carrier electron concentration to a low level, refractive index in a wavelength of 460 nm showed such high value as over 2.1. It should be noted that, in Reference Example 3, refractive index in a wavelength of 460 nm showed such high value as over 2.1, although the carrier electron mobility was low because of being amorphous.

Accordingly, these oxide sintered bodies of Examples 1 to 11 may be used as a sputtering target, however, cannot be used as a tablet for ion plating, because the sintered body density was over 5.5 g/cm$^3$.

On the other hand, in Comparative Example 1, the cerium content is set at 0.1% by atom, as an atomicity ratio of Ce/(In+Ce), outside the range of the present invention. Because of too low cerium content, the crystalline transparent conductive film formed by ion plating was not able to attain sufficient carrier electron concentration, and showed a specific resistance of $1.2\times10^{-3}$ Ω·cm, not attaining the level of equal to or lower than $8\times10^{-4}$ Ω·cm, required in applications of a blue LED or a solar cell and the like.

Similarly, in Comparative Example 2, the cerium content is set at 11% by atom, as an atomicity ratio of Ce/(In+Ce), outside the range of the present invention. Because of too high cerium content, the crystalline transparent conductive film formed by the ion plating method had low carrier electron mobility, and showed a specific resistance of $1.1\times10^{-3}$Ω·cm, not attaining the level of equal to or lower than $8\times10^{-4}$ Ω·cm, required in applications of a blue LED or a solar cell and the like.

In Comparative Example 3, because of using relatively coarse cerium oxide powder having a average particle diameter of 2 μm, as raw material powder, average particle diameter of the crystal grain composed of the $CeO_2$ phase dispersed in the oxide sintered body was over 3 μm. When film-formation was performed by an ion plating method using the oxide sintered body having such a texture as a tablet, it was confirmed that splash generated frequently with elapse of film-formation time. That is, it was clarified that, as in Examples 1 to 5, the texture of the oxide sintered body, where by using the cerium oxide powder adjusted to have an average particle diameter of equal to or smaller than 1.5 μm, and having the finely dispersed crystal grains composed of the $CeO_2$ phase, so as to have an average particle diameter of equal to or smaller than 3 μm, is effective to suppress splash generation.

In Comparative Example 4, the titanium content is set at 3% by atom, as an atomicity ratio of Ti/(In+Ce+Ti), outside the range of the present invention. Because of too high titanium content, the crystalline transparent conductive film formed by the ion plating method had too high carrier electron concentration, and showed a refractive index of 2.06, not attaining the level of 2.1, required in applications of a blue LED and the like.

The oxide sintered body of Comparative Example 5 contains tin different from the composition element of the oxide sintered body of the present invention, with the tin content of 3% by atom, as an atomicity ratio of Sn/(In+Ce+Sn), other than indium and cerium. Because of containing tin, the crystalline transparent conductive film formed by the ion plating method had too high carrier electron concentration, and showed a refractive index of 2.02, not attaining the level of 2.1, required in applications of a blue LED and the like.

Accordingly, these oxide sintered bodies of Comparative Examples 1 to 5 cannot be used as a tablet for ion plating.

Still more, in Reference Comparative Example 1, the cerium content is set at 0.1% by atom, as an atomicity ratio of Ce/(In+Ce), outside the range of the present invention. Because of too low cerium content, the crystalline transparent conductive film formed by sputtering was not able to attain sufficient carrier electron concentration, and showed a specific resistance of $1.3\times10^{-3}$ Ω·cm, not attaining the level of equal to or lower than $8\times10^{-4}$ Ω·cm, required in applications of a blue LED or a solar cell and the like.

Similarly, in Reference Comparative Example 2, the cerium content is set at 11% by atom, as an atomicity ratio of Ce/(In+Ce), outside the range of the present invention. Because of too high cerium content, the crystalline transparent conductive film formed by sputtering had decreased carrier electron mobility, and showed a specific resistance of $1.0\times10^{-3}$Ω·cm, not attaining the level of equal to or lower than $8\times10^{-4}$ Ω·cm, required in applications of a blue LED or a solar cell and the like.

In Reference Comparative Example 3, average particle diameter of the crystal grains composed of the $CeO_2$ phase finely dispersed in the oxide sintered body is over 3 μm, because relatively coarse cerium oxide powder with an average particle diameter of 2 μm was used. Direct-current sputtering was performed using the oxide sintered body having such a texture as a sputtering target, and nodule generation and frequent arcing generation were confirmed, after continuous sputtering for a long period of time. That is, it has become clear that a texture of the oxide sintered body having the crystal grains composed of the $CeO_2$ phase finely dispersed so as to have an average particle diameter of equal to or smaller than 3 μm, by using cerium oxide powder adjusted to have an average particle diameter of equal to or smaller than 1.5 μm, as in Reference Examples 1 to 11, is effective in suppressing nodule generation and arcing generation.

In Reference Comparative Example 4, the titanium content is set at 3% by atom, as an atomicity ratio of Ti/(In+Ce+Ti), outside the range of the present invention. Because of too high titanium content, the crystalline transparent conductive film formed by sputtering had too high carrier electron concentration, and showed a refractive index of 2.07, not attaining a refractive index of 2.1, required in applications of a blue LED and the like. The oxide sintered body of Reference Comparative Example 5 contains tin different from the composition element of the oxide sintered body of the present invention, with the tin content of 3% by atom, as an atomicity ratio of Sn/(In+Ce+Sn), other than indium and cerium. Because of containing tin, the crystalline transparent conductive film formed by sputtering had too high carrier electron concentration, and showed a refractive index of 2.04, not attaining the refractive index of 2.1 required in applications of a blue LED and the like.

Accordingly, these oxide sintered bodies of Reference Comparative Examples 1 to 5 cannot be used as a tablet for ion plating, because the sintered body density was over 5.5 g/cm$^3$.

INDUSTRIAL APPLICABILITY

The present invention provides the tablet for ion plating obtained by processing the oxide sintered body containing indium and cerium, which may be used in producing the oxide transparent conductive film by an ion plating method. This transparent conductive film is extremely useful industrially as a surface electrode for a blue LED (Light Emitting Diode) or a solar cell, and as a high refractive index film for an optical disk.

The invention claimed is:

1. A tablet for ion plating obtained by processing an oxide sintered body, comprising indium and cerium as oxides,
   wherein an atomicity ratio of Ce/(In+Ce) is 0.3 to 9%,
   wherein said oxide sintered body has an In$_2$O$_3$ phase of a bixbyite structure as a main crystal phase, and a CeO$_2$ phase of a fluorite-type structure finely dispersed as crystal grains having an average particle diameter of equal to or smaller than 3 μm, as a second phase, and
   wherein the tablet has a density of 3.4 to 5.5 g/cm$^3$.

2. The tablet for ion plating according to claim 1, wherein the In$_2$O$_3$ phase of a bixbyite structure is composed of crystal grains with two kinds of average particle diameters, consisting of a crystal grain with an average particle diameter of equal to or smaller than 2 μm and a crystal grain with an average particle diameter of equal to or larger than 2.5 μm.

3. The tablet for ion plating according to claim 1, wherein the cerium content is 0.3 to 5% by atom, as an atomicity ratio of Ce/(In+Ce).

4. The tablet for ion plating according to claim 1, wherein X-ray diffraction peak intensity ratio (I) defined by the following formula, is equal to or lower than 25%:

I=[CeO$_2$phase(111)/In$_2$O$_3$phase(222)]×100[%].

5. The tablet for ion plating according to claim 1, further comprising, as an oxide, at least one or more kinds of an metal element (M element) selected from the metal element group consisting of titanium, zirconium, hafnium, molybdenum and tungsten, wherein the cerium content of 0.3 to 9% by atom, as an atomicity ratio of Ce/(In+Ce+M), an M element content of equal to or lower than 1% by atom, as an atomicity ratio of M/(In+Ce+M), and a total content of cerium and M element of equal to or lower than 9% by atom, as an atomicity ratio of (Ce+M)/(In+Ce+M).

6. The tablet for ion plating according to claim 5, wherein the M element is titanium.

7. The tablet for ion plating according to claim 1, wherein the tablet does not contain tin.

8. A method of making the tablet according to claim 1, comprising:
   a step to obtain a oxide sintered body by mixing raw material powder consisting of indium oxide powder with an average particle diameter of equal to or smaller than 1.5 μm, indium oxide powder with an average particle diameter of equal to or larger than 2 μm and cerium oxide powder with an average particle diameter of equal to or smaller than 1.5 μm, then
   molding the mixed powder, and after sintering the molding by a normal pressure sintering method, or after molding and sintering the mixed powder by a hot press method, and a step to process the oxide sintered body,
   wherein that the oxide sintered body after sintering has an In$_2$O$_3$ phase of a bixbyite structure, as a main crystal phase, finely dispersed with a CeO$_2$ phase of a fluorite-type structure, as a second phase, as crystal grains having an average particle diameter of equal to or smaller than 3 μm, and has a density of 3.4 to 5.5 g/cm$^3$.

9. A method of making the tablet according to claim 1, comprising:
   a step to obtain a oxide sintered body by adding and mixing oxide powder of at least one or more kinds of an M element selected from the M metal element group consisting of titanium, zirconium, hafnium, molybdenum and tungsten, having an average particle diameter of equal to or smaller than 1.5 μm, to raw material powder consisting of indium oxide powder with an average particle diameter of equal to or smaller than 1.5 μm, indium oxide powder with an average particle diameter of equal to or larger than 2 μm, and cerium oxide powder with an average particle diameter of equal to or smaller than 1.5 μm, and then molding the mixed powder, and after sintering the molding by a normal pressure sintering method, or after molding and sintering the mixed powder by a hot press method, and
   a step to process the oxide sintered body,
   wherein that the oxide sintered body after sintering has an In$_2$O$_3$ phase of a bixbyite structure as a main crystal phase, has a CeO$_2$ phase of a fluorite-type structure finely dispersed as crystal grains having an average particle diameter of equal to or smaller than 3 μm, as a second phase, and has a density of 3.4 to 5.5 g/cm$^3$.

10. The production method for the tablet for ion plating according to claim 8 or 9, wherein that the mixed powder is sintered at a sintering temperature of 1000 to 1200° C. for 10 to 30 hours, under oxygen-containing atmosphere.

11. The production method for the tablet for ion plating according to claim 8 or 9, wherein that the mixed powder is sintered at a sintering temperature of 700 to 800° C. for 1 to 3 hours, under a pressure of 2.45 to 9.80 MPa, under inert gas atmosphere or in vacuum, by a hot press method.

* * * * *